United States Patent
Ramprasad et al.

(10) Patent No.: US 9,444,008 B2
(45) Date of Patent: *Sep. 13, 2016

(54) SEMICONDUCTOR NANOCRYSTALS AND COMPOSITIONS AND DEVICES INCLUDING SAME

(71) Applicant: QD VISION, INC., Lexington, MA (US)

(72) Inventors: Dorai Ramprasad, Columbia, MD (US); Craig Breen, Somerville, MA (US); Jonathan S. Steckel, Carlisle, MA (US)

(73) Assignee: QD VISION, INC., Lexington, MA (US)

( * ) Notice: Subject to any disclaimer, the term of this patent is extended or adjusted under 35 U.S.C. 154(b) by 41 days.

This patent is subject to a terminal disclaimer.

(21) Appl. No.: 14/246,275

(22) Filed: Apr. 7, 2014

(65) Prior Publication Data

US 2014/0312300 A1  Oct. 23, 2014

Related U.S. Application Data

(63) Continuation of application No. 13/768,714, filed on Feb. 15, 2013, now Pat. No. 8,691,114, which is a continuation of application No. 12/454,703, filed on May 21, 2009, now Pat. No. 8,377,333, which is a continuation of application No. PCT/US2007/024312, filed on Nov. 21, 2007.

(60) Provisional application No. 60/866,833, filed on Nov. 21, 2006, provisional application No. 60/866,839, filed on Nov. 21, 2006, provisional application No. 60/866,828, filed on Nov. 21, 2006, provisional application No. 60/866,832, filed on Nov. 21, 2006.

(51) Int. Cl.

| | |
|---|---|
| *C09K 11/08* | (2006.01) |
| *H01L 33/28* | (2010.01) |
| *B82Y 20/00* | (2011.01) |
| *B82Y 30/00* | (2011.01) |
| *C09K 11/02* | (2006.01) |
| *C09K 11/56* | (2006.01) |
| *C09K 11/88* | (2006.01) |
| *H01L 29/225* | (2006.01) |
| *H01L 33/06* | (2010.01) |

(52) U.S. Cl.
CPC ............. *H01L 33/28* (2013.01); *B82Y 20/00* (2013.01); *B82Y 30/00* (2013.01); *C09K 11/02* (2013.01); *C09K 11/565* (2013.01); *C09K 11/883* (2013.01); *H01L 29/225* (2013.01); *H01L 33/06* (2013.01); *Y10T 428/2991* (2015.01); *Y10T 428/2993* (2015.01)

(58) Field of Classification Search
CPC .................................................. H01L 33/502
See application file for complete search history.

(56) References Cited

U.S. PATENT DOCUMENTS

| 3,714,339 A | 1/1973 | Vecht |
|---|---|---|
| H429 H | 2/1988 | Harris et al. |

(Continued)

FOREIGN PATENT DOCUMENTS

| EP | 1 980 652 A2 | 10/2008 |
|---|---|---|
| WO | WO-99/26299 | 5/1999 |

(Continued)

OTHER PUBLICATIONS

Adachi et al., "High-efficiency red electrophosphorescence devices", Appl. Phys. Lett. 78, 1622 (2001).
Anikeeva et al., "Photoluminescence of CdSe/ZnS core/shell quantum dots enhanced by energy transfer from a phosphorescent donor", Chem. Phys. Lett., vol. 424 (2006), pp. 120-125.

(Continued)

*Primary Examiner* — Carol M Koslow

(57) ABSTRACT

A semiconductor nanocrystal including a core comprising a first semiconductor material comprising at least three chemical elements and a shell disposed over at least a portion of the core, the shell comprising a second semiconductor material, wherein the semiconductor nanocrystal is capable of emitting light with an improved photoluminescence quantum efficiency. Also disclosed are populations of semiconductor nanocrystals, compositions and devices including a semiconductor nanocrystal capable of emitting light with an improved photoluminescence quantum efficiency. In one embodiment, a semiconductor nanocrystal includes a core comprising a first semiconductor material comprising at least three chemical elements and a shell disposed over at least a portion of the core, the shell comprising a second semiconductor material, wherein the semiconductor nanocrystal is capable of emitting light upon excitation with a photoluminescence quantum efficiency greater than about 65%. In another embodiment, a semiconductor nanocrystal includes a core comprising a first semiconductor material comprising zinc, cadmium, and sulfur and a shell disposed over at least a portion of the core, the shell comprising a second semiconductor material. In a further embodiment, a semiconductor nanocrystal includes a core comprises a first semiconductor material comprising at least three chemical elements and a shell disposed over at least a portion of the core, the shell comprising a second semiconductor material comprising at least three chemical elements, wherein the semiconductor nanocrystal is capable of emitting light with a photoluminescence quantum efficiency greater than about 60% upon excitation. In a further embodiment, a semiconductor nanocrystal including a core comprises a first semiconductor material comprising zinc, cadmium, and selenium and a shell disposed over at least a portion of the core, the shell comprising a second semiconductor material, wherein the semiconductor nanocrystal is capable of emitting light with a photoluminescence quantum efficiency greater than about 60% upon excitation.

21 Claims, No Drawings

(56) References Cited

U.S. PATENT DOCUMENTS

| | | |
|---|---|---|
| 5,132,051 A | 7/1992 | Herron et al. |
| 5,152,229 A | 10/1992 | Nimmo |
| 5,162,939 A | 11/1992 | Herron et al. |
| 5,262,357 A | 11/1993 | Alivisatos et al. |
| 5,434,878 A | 7/1995 | Lawandy |
| 5,442,254 A | 8/1995 | Jaskie |
| 5,470,910 A | 11/1995 | Spanhel et al. |
| 5,474,591 A | 12/1995 | Wells et al. |
| 5,505,928 A | 4/1996 | Alivisatos et al. |
| 5,525,377 A | 6/1996 | Gallagher et al. |
| 5,527,386 A | 6/1996 | Statz |
| 5,532,184 A | 7/1996 | Kato |
| 5,534,056 A | 7/1996 | Kuehule et al. |
| 5,559,057 A | 9/1996 | Goldstein |
| 5,576,248 A | 11/1996 | Goldstein |
| 5,607,876 A | 3/1997 | Biegelsen et al. |
| 5,637,258 A | 6/1997 | Goldburt et al. |
| 5,663,573 A | 9/1997 | Epstein et al. |
| 5,766,779 A | 6/1998 | Shi et al. |
| 5,882,779 A | 3/1999 | Lawandy |
| 5,906,670 A | 5/1999 | Dobson et al. |
| 5,908,608 A | 6/1999 | Lawandy et al. |
| 5,949,089 A | 9/1999 | Kim et al. |
| 5,965,212 A | 10/1999 | Dobson et al. |
| 5,985,173 A | 11/1999 | Gray et al. |
| 5,997,958 A | 12/1999 | Sato et al. |
| 6,036,886 A | 3/2000 | Chhabra et al. |
| 6,103,868 A | 8/2000 | Heath et al. |
| 6,114,038 A | 9/2000 | Castro et al. |
| 6,157,047 A | 12/2000 | Fujita et al. |
| 6,179,912 B1 | 1/2001 | Barbera-Guillem et al. |
| 6,207,229 B1 | 3/2001 | Bawendi et al. |
| 6,225,198 B1 | 5/2001 | Alivisatos et al. |
| 6,235,618 B1 | 5/2001 | Jeong-Sook et al. |
| 6,241,819 B1 | 6/2001 | Bhargava et al. |
| 6,251,303 B1 | 6/2001 | Bawendi et al. |
| 6,262,129 B1 | 7/2001 | Murray et al. |
| 6,287,928 B1 | 9/2001 | Yamashita |
| 6,294,401 B1 | 9/2001 | Jacobson et al. |
| 6,306,610 B1 | 10/2001 | Bawendi et al. |
| 6,322,901 B1 | 11/2001 | Bawendi et al. |
| 6,326,144 B1 | 12/2001 | Bawendi et al. |
| 6,329,668 B1 | 12/2001 | Razeghi |
| 6,333,110 B1 | 12/2001 | Barbera-Guillem |
| 6,379,635 B2 | 4/2002 | O'Brien et al. |
| 6,391,273 B1 | 5/2002 | Konrad et al. |
| 6,440,213 B1 | 8/2002 | Alivisatos et al. |
| 6,447,698 B1 | 9/2002 | Ihara et al. |
| 6,475,886 B2 | 11/2002 | Kim et al. |
| 6,501,091 B1 * | 12/2002 | Bawendi ............... B82Y 10/00 257/100 |
| 6,576,291 B2 | 6/2003 | Bawendi et al. |
| 6,617,583 B1 | 9/2003 | Bawendi et al. |
| 6,639,354 B1 | 10/2003 | Kojima et al. |
| 6,649,138 B2 | 11/2003 | Adams et al. |
| 6,682,596 B2 | 1/2004 | Zehnder et al. |
| 6,724,141 B2 | 4/2004 | Andriessen |
| 6,734,465 B1 * | 5/2004 | Taskar ................. H01L 33/502 257/100 |
| 6,780,242 B2 | 8/2004 | Norris |
| 6,803,719 B1 | 10/2004 | Miller et al. |
| 6,815,064 B2 | 11/2004 | Treadway et al. |
| 6,821,559 B2 | 11/2004 | Eberspacher et al. |
| 6,838,743 B2 | 1/2005 | Yamada et al. |
| 6,838,816 B2 | 1/2005 | Su et al. |
| 6,846,565 B2 | 1/2005 | Korgel et al. |
| 6,849,862 B2 | 2/2005 | Nikolaev et al. |
| 6,855,202 B2 | 2/2005 | Alivisatos et al. |
| 6,869,545 B2 | 3/2005 | Peng et al. |
| 6,869,864 B2 | 3/2005 | Yim et al. |
| 6,870,311 B2 * | 3/2005 | Mueller ............... H01L 33/501 257/98 |
| 6,872,249 B2 | 3/2005 | Peng et al. |
| 6,872,450 B2 | 3/2005 | Liu et al. |
| 6,890,777 B2 | 5/2005 | Bawendi et al. |
| 6,918,946 B2 | 7/2005 | Korgel et al. |
| 6,939,604 B1 | 9/2005 | Guyot-Sionnest et al. |
| 6,955,855 B2 | 10/2005 | Naasani |
| 6,955,856 B2 | 10/2005 | Lee et al. |
| 6,972,455 B2 | 12/2005 | Liu |
| 6,977,182 B2 | 12/2005 | Sato et al. |
| 6,992,317 B2 | 1/2006 | Jain et al. |
| 7,005,669 B1 | 2/2006 | Lee |
| 7,008,559 B2 | 3/2006 | Chen |
| 7,056,471 B1 | 6/2006 | Han et al. |
| 7,147,712 B2 | 12/2006 | Zehnder et al. |
| 7,160,613 B2 | 1/2007 | Bawendi et al. |
| 7,175,948 B2 | 2/2007 | Yoshihara et al. |
| 7,199,393 B2 | 4/2007 | Park et al. |
| 7,250,082 B2 | 7/2007 | Jang et al. |
| 7,253,452 B2 | 8/2007 | Steckel et al. |
| 7,332,211 B1 | 2/2008 | Bulovic et al. |
| 7,399,429 B2 | 7/2008 | Liu et al. |
| 7,422,790 B1 | 9/2008 | Scher et al. |
| 7,632,428 B2 | 12/2009 | Peng et al. |
| 7,687,800 B1 | 3/2010 | Kar et al. |
| 7,776,630 B1 | 8/2010 | Kar et al. |
| 7,777,233 B2 | 8/2010 | Kahen et al. |
| 7,855,091 B1 | 12/2010 | Kar et al. |
| 7,919,012 B2 | 4/2011 | Peng et al. |
| 7,935,419 B1 | 5/2011 | Hollingsworth et al. |
| 7,964,278 B2 | 6/2011 | Banin et al. |
| 8,003,010 B2 | 8/2011 | Landry et al. |
| 8,080,437 B2 | 12/2011 | Steckel et al. |
| 8,377,333 B2 * | 2/2013 | Ramprasad ............ C09K 1/883 252/301.4 R |
| 8,404,154 B2 * | 3/2013 | Breen .................... B82Y 20/00 252/301.4 R |
| 8,691,114 B2 * | 4/2014 | Ramprasad ............ B82Y 20/00 252/301.4 R |
| 8,906,265 B2 * | 12/2014 | Breen .................... B82Y 20/00 252/301.4 R |
| 8,980,133 B2 * | 3/2015 | Ramprasad .......... C09K 11/565 252/301.4 R |
| 2001/0040232 A1 | 11/2001 | Bawendi et al. |
| 2001/0055764 A1 | 12/2001 | Empedocles et al. |
| 2002/0071952 A1 | 6/2002 | Bawendi et al. |
| 2003/0010987 A1 | 1/2003 | Banin et al. |
| 2003/0017264 A1 | 1/2003 | Treadway et al. |
| 2003/0230970 A1 | 12/2003 | Steckl et al. |
| 2004/0023010 A1 | 2/2004 | Bulovic et al. |
| 2004/0033359 A1 | 2/2004 | Bawendi et al. |
| 2004/0091710 A1 | 5/2004 | Bawendi et al. |
| 2004/0110002 A1 | 6/2004 | Kim et al. |
| 2004/0209115 A1 | 10/2004 | Thompson et al. |
| 2004/0241424 A1 | 12/2004 | Barbera-Guillem |
| 2005/0012182 A1 | 1/2005 | Jang et al. |
| 2005/0031888 A1 | 2/2005 | Bawendi et al. |
| 2005/0072989 A1 | 4/2005 | Bawendi et al. |
| 2005/0088380 A1 | 4/2005 | Bulovic et al. |
| 2005/0112849 A1 | 5/2005 | Stott et al. |
| 2005/0117868 A1 | 6/2005 | Chen et al. |
| 2005/0129947 A1 | 6/2005 | Peng et al. |
| 2005/0135079 A1 | 6/2005 | Yin Chua et al. |
| 2005/0136258 A1 | 6/2005 | Nie et al. |
| 2005/0214536 A1 | 9/2005 | Schrier et al. |
| 2005/0258418 A1 | 11/2005 | Steckel et al. |
| 2005/0274944 A1 | 12/2005 | Jang et al. |
| 2005/0287691 A1 | 12/2005 | Chen et al. |
| 2006/0001119 A1 | 1/2006 | Liu et al. |
| 2006/0014040 A1 | 1/2006 | Peng et al. |
| 2006/0014315 A1 | 1/2006 | Chan et al. |
| 2006/0019427 A1 | 1/2006 | Cao |
| 2006/0028882 A1 | 2/2006 | Qu |
| 2006/0039850 A1 | 2/2006 | Jun et al. |
| 2006/0062720 A1 | 3/2006 | Jang et al. |
| 2006/0062902 A1 | 3/2006 | Sager et al. |
| 2006/0063029 A1 | 3/2006 | Jang et al. |
| 2006/0068154 A1 | 3/2006 | Parce et al. |
| 2006/0105199 A1 | 5/2006 | Gerlach et al. |
| 2006/0114960 A1 | 6/2006 | Snee |
| 2006/0131361 A1 | 6/2006 | Eastman et al. |
| 2006/0157686 A1 | 7/2006 | Jang et al. |
| 2006/0157720 A1 | 7/2006 | Bawendi et al. |

(56) References Cited

U.S. PATENT DOCUMENTS

| | | |
|---|---|---|
| 2006/0158089 A1 | 7/2006 | Saito et al. |
| 2006/0196375 A1 | 9/2006 | Coe-Sullivan et al. |
| 2006/0232194 A1 | 10/2006 | Tung et al. |
| 2007/0034856 A1 | 2/2007 | Ohsawa et al. |
| 2007/0087219 A1 | 4/2007 | Ren et al. |
| 2007/0103068 A1 | 5/2007 | Bawendi et al. |
| 2007/0111324 A1 | 5/2007 | Nie et al. |
| 2007/0197003 A1 | 8/2007 | Yen et al. |
| 2007/0243382 A1 | 10/2007 | Chan et al. |
| 2007/0289491 A1 | 12/2007 | Peng et al. |
| 2008/0001167 A1 | 1/2008 | Coe-Sullivan et al. |
| 2008/0012031 A1 | 1/2008 | Jang et al. |
| 2008/0038558 A1 | 2/2008 | Landry et al. |
| 2008/0074050 A1 | 3/2008 | Chen et al. |
| 2008/0169753 A1 | 7/2008 | Skipor et al. |
| 2008/0172197 A1 | 7/2008 | Skipor et al. |
| 2008/0202383 A1 | 8/2008 | Shi |
| 2009/0001385 A1 | 1/2009 | Skipor et al. |
| 2009/0001403 A1 | 1/2009 | Skipor et al. |
| 2009/0002806 A1 | 1/2009 | Skipor et al. |
| 2009/0017268 A1 | 1/2009 | Skipor et al. |
| 2009/0059554 A1 | 3/2009 | Skipor et al. |
| 2009/0152567 A1 | 6/2009 | Comerford et al. |
| 2009/0162011 A1 | 6/2009 | Coe-Sullivan et al. |
| 2009/0174022 A1 | 7/2009 | Coe-Sullivan et al. |
| 2009/0181478 A1 | 7/2009 | Cox et al. |
| 2009/0208753 A1 | 8/2009 | Coe-Sullivan et al. |
| 2009/0215208 A1 | 8/2009 | Coe-Sullivan et al. |
| 2009/0215209 A1 | 8/2009 | Anc et al. |
| 2009/0251759 A1 | 10/2009 | Domash et al. |
| 2009/0278141 A1 | 11/2009 | Coe-Sullivan et al. |
| 2009/0280586 A1 | 11/2009 | Coe-Sullivan |
| 2009/0283742 A1 | 11/2009 | Coe-Sullivan et al. |
| 2009/0283743 A1 | 11/2009 | Coe-Sullivan et al. |
| 2009/0283778 A1 | 11/2009 | Coe-Sullivan et al. |
| 2009/0286338 A1 | 11/2009 | Coe-Sullivan |
| 2010/0001256 A1 | 1/2010 | Coe-Sullivan et al. |
| 2010/0014799 A1 | 1/2010 | Bulovic et al. |
| 2010/0025595 A1 | 2/2010 | Bawendi et al. |
| 2010/0044635 A1 | 2/2010 | Breen et al. |
| 2010/0044636 A1 | 2/2010 | Ramprasad et al. |
| 2010/0051870 A1 | 3/2010 | Ramprasad |
| 2010/0051901 A1 | 3/2010 | Kazlas et al. |
| 2010/0052512 A1 | 3/2010 | Clough et al. |
| 2010/0068468 A1 | 3/2010 | Coe-Sullivan et al. |
| 2010/0132770 A1 | 6/2010 | Beatty et al. |
| 2010/0134520 A1 | 6/2010 | Coe-Sullivan et al. |
| 2010/0243053 A1 | 9/2010 | Coe-Sullivan et al. |
| 2010/0264371 A1 | 10/2010 | Nick |
| 2010/0265307 A1 | 10/2010 | Linton et al. |
| 2010/0283014 A1 | 11/2010 | Breen et al. |
| 2010/0283036 A1 | 11/2010 | Coe-Sullivan et al. |
| 2010/0283072 A1 | 11/2010 | Kazlas et al. |
| 2010/0289001 A1 | 11/2010 | Kahen et al. |
| 2010/0289003 A1 | 11/2010 | Kahen et al. |
| 2010/0314646 A1 | 12/2010 | Breen et al. |
| 2011/0081538 A1 | 4/2011 | Linton |
| 2011/0095261 A1 | 4/2011 | Kazlas |
| 2011/0127932 A1 | 6/2011 | Halpert et al. |
| 2011/0245533 A1 | 10/2011 | Breen et al. |
| 2013/0221291 A1 | 8/2013 | Ramprasad et al. |

FOREIGN PATENT DOCUMENTS

| | | |
|---|---|---|
| WO | WO-03/050329 A2 | 6/2003 |
| WO | WO-2005/001889 A2 | 1/2005 |
| WO | WO-2005/002007 A2 | 1/2005 |
| WO | WO-2005/031802 A2 | 4/2005 |
| WO | WO-2005/052996 A2 | 6/2005 |
| WO | WO-2005/067524 A2 | 7/2005 |
| WO | WO-2005/867823 A3 | 9/2005 |
| WO | WO-2006/027778 A1 | 3/2006 |
| WO | WO-2007/143197 A2 | 12/2007 |
| WO | WO-2008/021962 A2 | 2/2008 |
| WO | WO-2008/021962 A3 | 2/2008 |
| WO | WO-2008/063652 A1 | 5/2008 |
| WO | WO-2008/063653 A1 | 5/2008 |
| WO | WO-2008/063657 A3 | 5/2008 |
| WO | WO-2008/063658 A3 | 5/2008 |

OTHER PUBLICATIONS

Bailey, et al., "Alloyed semiconductor quantum dots: tuning the optical properties without changing the particle size", J. Am. Chem. Soc., 2003, 125, 7100-7106.

Cao, et al., "Growth and properties of semiconductor core/shell nanocrystals with InAs cores", J, Am. Chem. Soc., 2000, 122, 9692-9702.

Chen, et al., "Colloidal ZnSe, ZnSe/ZnS, and ZnSe/ZnSeS quantum dots synthesized from ZnO", J. Phys. Chem. B, 204, 108, 17119-17123.

Cizeron, J., et al., "Solid solution of $Cd_yZn_{1-y}S$ nanosized particles: photophysical properties", J. Phys. Chem B, 1997, 101 (44), pp. 8887-8891.

Coe-Sullivan et al., "Large-Area Ordered Quantum-Dot Monolayers via Phase Separation During Spin-Casting", Adv. Funct. Mater., vol. 15 (2005), pp. 1117-1124.

Coe-Sullivan, et al., "Electroluminescence from single monolayers of nanocrystals in molecular organic devices", Nature, vol. 420, 19/26, Dec. 2002, pp. 800-803.

Coe-Sullivan et al., "Turning the performance of hybrid organic/inorganic quantum dot light-emitting devices", Organic Electronics, vol. 4 (2003), pp. 123-130.

Coe-Sullivan, "Hybrid Organic/Quantum Dot Thin Film Structures and Devices", MIT Thesis in partial fulfillment of Ph.D. in Electrrical Engineering and Computer Science (2005).

Coe-Sullivan et al., "Method for fabrication of saturated RGB quantum dot light emitting devices", Proc. Of SPIE, vol. 5739 (2005), pp. 108-115.

Final Office Action, mailed Jan. 15, 2013, in copending U.S. Appl. No. 12/454,709 of Ramprasad, filed May 21, 2009.

Final Office Action, mailed Mar. 30, 2011, in copending U.S. Appl. No. 12/454,705 of Kazlas, filed May 21, 2009.

Final Office Action, mailed Aug. 27, 2013, in copending U.S. Appl. No. 12/454,705 of Kazlas, filed May 21, 2009.

Final Office Action, mailed Sep. 9, 2011, in U.S. Appl. No. 12/454,703 of Ramprasad, et al., filed May 21, 2009, now U.S. Pat. No. 8,377,333.

Non-Final Office Action, mailed Mar. 24, 2014, in copending U.S. Appl. No. 12/454,709 of Ramprasad, filed May 21, 2009.

Non-Final Office Action, mailed Mar. 25, 2014, in copending U.S. Appl. No. 12/454,705 of Kazlas, filed May 21, 2009.

Non-Final Office Action, mailed Mar. 27, 2012, in copending U.S. Appl. No. 12/454,709 of Ramprasad, filed May 21, 2009.

Non-Final Office Action, mailed Jul. 26, 2013 in U.S. Appl. No. 13/768,714 of Ramprasad, filed Feb. 15, 2013, which issued as U.S. Pat. No. 8,691,114 on Apr. 8, 2014.

Notice of Allowance, mailed Nov. 18, 2013, in U.S. Appl. No. 13/768,714 of Ramprasad, filed Feb. 15, 2013, which issued as U.S. Pat. No. 8,691,114 on Apr. 8, 2014.

Dabbousi, et al, "(CdSe)ZnS Core-Shell Quantum Dots : Synthesis and Characterization of a Size Series of Highly Luminescent Nanocrystallites", J. Phys. Chem., 101, 9463 (1997).

Dirr, et al., "Organic Light Emitting Diodes with Reduced Spectral and Spacial Halfwidths", Jpn. J. Appl. Phys. 37, 1457 (1998).

Donega, et al."Single-Step Synthesis to Control the Photoluminescence Quantum Yield and Size Dispersion of CdSe Nanocrystals", J. Phys. Chem. B 2003, 107,489-496.

Eason, et al., "High-brightness blue and green light-emitting diodes", Appl. Phys. Lett., 66 (2) 115,, Jan. 9, 1995.

Empedocles, et al., "Photoluminescence spectroscopy of single CdSe nanocrystallite quantum dots". Phys. Rev. Lett. vol. 77, No. 18, 1996, pp. 3873 et seq.

Harrison, et al., "Wet chemical synthesis and spectroscopic study of CdHgTe nanocrystals with strong near-infrared luminescence", Mater. Sci. & Engineering B69-70 (2000) 355-360.

(56) References Cited

OTHER PUBLICATIONS

Hines, et al., "Bright UV-blue luminescent colloidal ZnSe nanocrystals" J. Phys. Chem. B., vol. 102, No. 19, 1998, pp. 3655 et seq.

Hines, et al., "Synthesis and characterization of highly luminescing ZnS-capped CdSe nanocrystals", J. Phys. Chem., 1996, 100, 468-471.

Ivanov, et al., "Light amplification using inverted core/shell nanocrystals: towards lasing in the single-exciton regime", J. Phys. Chem. B 2004, 108, 10625-10630.

Jang, et al., "High quality CdSeS nanocrystals synthesized by facile single injection process and their electroluminescence", Chem. Commun., 2003, 2964-2966.

Jiang, et al., "Optimizing the synthesis of red- to near-IR-emitting CdS-capped $CdTe_xS_{1-x}$ alloyed quantum dots for biomedical imaging". Chem. Mater., 2006, 18, 4845-4854.

Jun, et al., "Interfused semiconductor nanocrystals: brilliant blue photoluminescence and electroluminescence", Chem. Comm., 2005, 4616-4618.

Kim, S-W., et al., "Engineering $InAs_xP_{1-x}/InP/SnSe$ III-V alloyed core/shell quantum dots for the near-infrared", J. Amer. Chem. Soc., 2005, 127, 10526-10532.

Korgel, et al., "Controlled synthesis of mixed core and layered (Zn,Cd)S and (Hg,Cd)S nanocrystals within phosphatidylcholine vesicles", Langmuir 2000, 16, 3588-3594.

Li, et al., "High quality ZnSe and ZnS nanocrystals formed by activating zinc carboxylate precursors", Nano Letters, 2004, vol. 4, No. 11, 2261-2264

Lim, et al., "Preparation of highly luminescent nanocrystals and their application in light-emitting diodes", Adv. Mater., 2007, 10, 1827-1832.

Liu, et al., "Mechanistic study of precursor evolution in colloidal group II-VI semiconductor nanocrystal synthesis", J. Am. Chem. Soc., 2007, 2129, 305-312.

Moeller, et al., Quantum-dot light-emitting devices for displays, Information Display, Feb. 2006, pp. 2-6.

Murray, et al., "Synthesis and Characterization of Nearly Monodisperse CdE (E=S, Se, Te) Semiconductor Nanocrystallites", J. Am. Chem. Soc., 115:8706 (1993).

Murray, Christopher Bruce, MIT PhD Thesis, entitled "Synthesis and Characterization of II-VI Quantum Dot and Their Assembly into 3D Quantum dot Superlattices" Sep. 1993.

PCT/US2007/024305 International Preliminary Report on Patentability (parent of U.S. Appl. No. 12/454,701, filed May 21, 2009).

PCT/US2007/024306 International Preliminary Report on Patentability (parent of U.S. Appl. No. 12/454,709, filed May 21, 2009).

PCT/US2007/024310 International Preliminary Report on Patentability (parent of U.S. Appl. No. 12/454,705, filed May 21, 2009).

PCT/US2007/024312 International Preliminary Report on Patentability (parent of U.S. Appl. No. 12/454,703, filed May 21, 2009).

Petrov, "Size and band-gap dependences of the first hyperpolarizability of CdxZn1-xS nanocrystals", J. Phys. Chem. B 2002, 106, 5325-5334.

Protiere, et al., "Highly luminescent $Cd_{1-x}Zn_xSe/ZnSe$ core/shell nanocrystals emitting in the blue-green spectral region", Small, 2007, 3. No. 3, 399-403.

Qu, et al., "Control of photoluminescence properties of CdSe nanocrystals in growth", J. Am. Chem. Soc., vol. 124, No. 9, 2002, pp. 2049 et seq.

Seedorf, et al., "Compartive study of molecular beam and migration-enhanced epitaxy of ZnCdSe quantum wells: influence on interface and composition fluctuations", J. Cryst. Growth, 214/215 (2000) 602-605.

Shan, et al., "Growth and evolution of ZnCdSe quantum dots", J. Vac. Sci. Technol. B, 20(3), May/Jun. 2002, pp. 1102-1106.

Shih, et al., "Photoluminescence of $ZnSe_xTe_{1-x}/ZnTe$ multiple-quantum-well structures grown by molecular-beam epitaxy", J. Appl. Phys., 2004, vol. 96, No. 12, 7267-7271.

Steckel et al., "1.3 μm to 1.55 μm Tunable Electroluminescence from PbSe Quantum Dots Embedded within an Organic Device," Adv. Mater., vol. 15, No. 21, (2003), pp. 1862-1866.

Steckel, et al., "Blue luminescence from (CdS)ZnS Core-Shell Nanocrystals", Agnew. Chem. Int. Ed., 2004, 43, 2154-2158.

Steckel, et al., "Color-saturated green-emitting QD-LEDs", Agnew. Chem. Int. Ed., 2006, 45, 5796-5799.

Steckel, Jonathan S., Ph.D. Thesis entitled "The Synthesis of Inorganic Semiconductor Nanocrystalline Materials For the Purpose of Creating Hybrid Organic/Inorganic Light-Emitting Devices", Massachusetts Institute of Technology, Feb. 2006.

Supran, et al., "QLEDs for displays and solid-state lighting", *MRS Bulletin*, vol. 38 (2013), pp. 703-711.

Talapin, et al., "Highly luminescent monodisperse CdSe and CdSe/ZnS nanocrystals synthesized in a hexadecylamine-trioctylphosphine oxide-trioctyl phosphine mixture", Nano Letters, 2001, vol. 1, No. 4, 207-211.

Wang, et al., "Room-temperature synthesis and characterization of nanocrystalline CdS, ZnS, and $Cd_xZn_{1-x}S$", Chem. Mater., 2002, 14, 3028-3033.

Xie, et a., "Preparation and Characterization of Overcoated II-VI Quantum Dots", J. Nanosci. And Nanotech., vol. 5, No. 6, Jun. 2005, pp. 880-886(7).

Xie, et al., "Synthesis and characterization of highly luminescent CdSe-core $CdZn_{0.5}Cd_{0.5}/ZnS$ multishell nanocrystals", J. Amer. Chem. Soc., 2005, 127, 7480-7488.

Xing, et al., "Bioconjugated quantum dots for multiplexed and quantitative immunohistochemistry", Nature Protocols, 2007, vol. 2, No. 5, 1152-1165.

Yamasaki et al., "Organic light-emitting device with an ordered monolayer of silia microspheres as a scattering medium", Appl. Phys. Lett. 76, 1243 (2000).

Yu, et al., "Formation of high-quality CdS and other II-VI semiconductor nanocrystals in noncoordinating solvents: tunable reactivity of monomers". Agnew. Chem. Int. Ed., 2002, 41, No. 13, 2368-2371.

Zhong, et al., "Alloyed $Zn_xCd_{1-x}S$ nanocrystals with highly narrow luminescence spectral width", J. Amer. Chem. Soc., 2003, 125, 13559-13563.

Zhong, et al., "Composition-tunable $Zn_xCd_{1-x}Se$ nanocrystals with high luminescence and stability", J. Am. Chem. Soc., 2003, 125, 8589-8594.

Zhong, et al., "Embryonic nuclei-induced alloying process for the reproducible synthesis of blue-emitting $Zn_xCd_{1-x}Se$ nanocrystals with long-time thermal stability in size distribution and emission wavelength", J. Phys. Chem. B, 2004, 108, 15552-15559.

Zhong, et al., High-quality violet-to red-emitting ZnSe/CdSe core/shell nanocrystals, Chem. Mater., 2006, 17, 4038-4042.

\* cited by examiner

SEMICONDUCTOR NANOCRYSTALS AND COMPOSITIONS AND DEVICES INCLUDING SAME

This application is a continuation of commonly owned U.S. patent application Ser. No. 13/768,714, filed 15 Feb. 2013, which issued as U.S. Pat. No. 8,691,114 on 8 Apr. 2014, which is a continuation of U.S. patent application Ser. No. 12/454,703 filed 21 May 2009, which issued as U.S. Pat. No. 8,377,333 on 19 Feb. 2013, which is a continuation of PCT Application No. PCT/US2007/024312 filed 21 Nov. 2007, which was published in the English language as PCT Publication No. WO 2008/063658 on 29 May 2008. The PCT Application claims priority to U.S. Application Nos. 60/866,833, filed 21 Nov. 2006, 60/866,839, filed 21 Nov. 2006, 60/866,828, filed 21 Nov. 2006, and 60/866,832, filed 21 Nov. 2006. The disclosures of each of the foregoing applications are hereby incorporated herein by reference in their entireties.

TECHNICAL FIELD OF THE INVENTION

The technical field of the invention relates to semiconductor nanocrystals and compositions and devices including same.

SUMMARY OF THE INVENTION

The present invention relates to a semiconductor nanocrystal including a core comprising a first semiconductor material comprising at least three chemical elements and a shell disposed over at least a portion of the core, the shell comprising a second semiconductor material, wherein the semiconductor nanocrystal is capable of emitting light with an improved photoluminescence quantum efficiency. The present invention further relates to populations, compositions and devices including semiconductor nanocrystals capable of emitting light with an improved photoluminescence quantum efficiency, wherein at least a portion of the semiconductor nanocrystal including a core comprising a first semiconductor material comprising at least three chemical elements and a shell disposed over at least a portion of the core, the shell comprising a second semiconductor material.

Photoluminescence quantum efficiency (also referred to herein as quantum yield or solution quantum yield) represents the percent of absorbed photons that are reemitted as photons.

In accordance with one aspect of the invention there is provided a semiconductor nanocrystal including a core comprising a first semiconductor material comprising at least three chemical elements and a shell disposed over at least a portion of the core, the shell comprising a second semiconductor material, wherein the semiconductor nanocrystal is capable of emitting light with a photoluminescence quantum efficiency greater than about 65% upon excitation.

In certain embodiments, the semiconductor nanocrystal is capable of emitting light with a photoluminescence quantum efficiency greater than about 70% upon excitation.

In certain embodiments, the semiconductor nanocrystal is capable of emitting light with a photoluminescence quantum efficiency greater than about 80% upon excitation.

In certain embodiments, the semiconductor nanocrystal is capable of emitting light with a photoluminescence quantum efficiency greater than about 90% upon excitation.

In certain embodiments, the semiconductor nanocrystal is capable of emitting light with a photoluminescence quantum efficiency greater than about 95% upon excitation.

In certain embodiments, the semiconductor nanocrystal is capable of emitting light with a photoluminescence quantum efficiency of about 100% upon excitation.

In certain embodiments, the light includes a maximum peak emission with a full width at half maximum of not more than 50 nm, not more than 40 nm, not more than 30 nm, or not more than 20 nm.

The core comprises a first semiconductor material comprising at least three chemical elements.

Non-limiting examples of first semiconductor materials comprising at least three chemical elements that can be included in a core of a semiconductor nanocrystal in accordance with various aspects and embodiments of the inventions disclosed and claimed in herein include compositions represented by the general formula MA wherein M comprises at least two different chemical elements and A comprises at least one chemical element or wherein M comprises at least one chemical element and A comprises at least two different chemical elements. In certain examples, M comprises one or more elements from Group IA (for example, lithium, sodium, rubidium, and cesium), Group IIA (for example, beryllium, magnesium, calcium, strontium, and barium), Group IIB (for example, Zn, Cd, and Hg), Group IIIA (for example, B, Al, Ga, In, and Tl), Group IVA (for example, Si, Ge, Sn and Pb), or the transition metals (for example, Ti, Zr, Hf, V, Nb, Ta, Cr, Mo, W, Mn, Tc, Re, Fe, Co, Ni, Pd, Pt, Rh, and the like). (See, F. A. Cotton et al., Advanced Inorganic Chemistry, 6th Edition, (1999). In certain examples, A comprises one or more elements selected from Group VA (for example, nitrogen, phosphorus, arsenic, antimony, and bismuth) and/or Group VIA (for example, oxygen, sulfur, selenium, and tellurium). Other semiconductor materials suitable for inclusion in the core can be used. The first semiconductor material is preferably an inorganic semiconductor material.

In certain embodiments, M comprises one or more chemical elements from Group IIA and/or Group IIB and A comprises one or more chemical elements from Group VIA.

In certain embodiments, M comprises one or more chemical elements from Group IIA and/or Group IIB and A comprises one or more chemical elements from Group VA.

In certain other embodiments, M comprises one or more chemical elements from Group IIIA and A comprises one or more chemical elements from Group VA.

In certain embodiments, M comprises one or more chemical elements from Group IVA and A comprises one or more chemical elements from Group VIA.

In certain embodiments, M comprises one or more chemical elements from Group IA and/or Group IIIA and A comprises one or more chemical elements from Group VIA.

In certain embodiments, M comprises one or more chemical elements from Group IIA and/or Group IVA and A comprises one or more chemical elements from Group VA.

In certain other embodiments, the first semiconductor material does not include an element from Group IIA.

In certain embodiments, the first semiconductor material comprises zinc, cadmium, and sulfur.

In certain embodiments, a first semiconductor material comprises $Zn_xCd_{1-x}S$, wherein $0<x<1$. In certain embodiments, $0<x\leq0.5$. In certain embodiments, $0<x\leq0.3$. In certain embodiments, $0.05<x<0.2$. In certain embodiments, $0.1\leq x\leq0.15$. In certain embodiments, x is from about 0.10 to about 0.12.

In certain embodiments, the first semiconductor material comprises zinc, cadmium, and selenium.

In certain embodiments, the first semiconductor material comprises $Zn_{1-x}Cd_xSe$, wherein $0<x<1$.

In certain embodiments, the core can comprise an alloy of three or more chemical elements.

In certain embodiments, the core can comprise a homogeneous alloy of the three or more chemical element.

The shell comprises a second semiconductor material. A second semiconductor material can comprise one or more chemical elements.

Non-limiting examples of second semiconductor materials that can be included in a semiconductor nanocrystal in accordance with various aspects and embodiments of the inventions disclosed and claimed in herein include compositions including a chemical element from Group IVA and compositions represented by the general formula M'A' wherein M' comprises at least one chemical elements and A' comprises at least one chemical element. In certain examples, M' comprises one or more elements from Group IA (for example, lithium, sodium, rubidium, and cesium), Group IIA (for example, beryllium, magnesium, calcium, strontium, and barium), Group IIB (for example, Zn, Cd, or Hg), Group IIIA (for example, Al, Ga, or In), Group IVA (for example, Si, Ge, Sn or Pb), or the transition metals (for example, Ti, Zr, Hf, V, Nb, Ta, Cr, Mo, W, Mn, Tc, Re, Fe, Co, Ni, Pd, Pt, Rh, and the like). (See, F. A. Cotton et al., Advanced Inorganic Chemistry, 6th Edition, (1999). In certain examples, A' comprises one or more elements selected from Group VA (for example, nitrogen, phosphorus, arsenic, antimony, and bismuth) and/or Group VIA (for example, oxygen, sulfur, selenium, and tellurium). Other semiconductor materials suitable for inclusion in the shell can be used. The second semiconductor material is preferably an inorganic semiconductor material.

In certain embodiments, M' comprises one or more chemical elements from Group IIA and/or Group IIB and A' comprises one or more chemical elements from Group VIA.

In certain embodiments, M' comprises one or more chemical elements from Group IIA and/or Group IIB and A' comprises one or more chemical elements from Group VA.

In certain other embodiments, M' comprises one or more chemical elements from Group IIIA and A' comprises one or more chemical elements from Group VA.

In certain embodiments, M' comprises one or more chemical elements from Group IVA and A' comprises one or more chemical elements from Group VIA.

In certain embodiments, M' comprises one or more chemical elements from Group IA and/or Group IIIA and A' comprises one or more chemical elements from Group VIA.

In certain embodiments, M' comprises one or more chemical elements from Group IIA and/or Group IVA and A' comprises one or more chemical elements from Group VA.

In certain embodiments, the second semiconductor material does not include an element from Group IIA.

In certain embodiments, the second semiconductor material is not an oxide.

In certain embodiments, the second semiconductor material comprises zinc and sulfur. In certain embodiments, the second semiconductor material comprises ZnS.

In certain embodiments, the shell can comprise an alloy of three or more chemical elements.

In certain embodiments, the shell can comprise a homogeneous alloy of three or more chemical elements.

In certain embodiments, the first semiconductor material comprises $Zn_xCd_{1-x}S$, wherein $0<x<1$ and the second semiconductor material comprises ZnS.

In certain other embodiments, the second semiconductor material comprises zinc, cadmium, and sulfur.

In certain embodiments, the second semiconductor material comprises $Cd_xZn_{1-x}S$ wherein $0<x<1$. In certain more detailed embodiments, the first semiconductor material can comprise $Zn_{1-x}Cd_xSe$, wherein $0<x<1$, and the second semiconductor material can comprise $Cd_xZn_{1-x}S$ wherein $0<x<1$.

In accordance with another aspect of the invention there is provided a semiconductor nanocrystal including a core comprising a first semiconductor material comprising cadmium, zinc and sulfur and a shell disposed over at least a portion of the core, the shell comprising a second semiconductor material.

In certain embodiments, a first semiconductor material comprises $Zn_xCd_{1-x}S$, wherein $0<x<1$. In certain embodiments, $0<x\leq0.5$. In certain embodiments, $0<x\leq0.3$. In certain embodiments, $0.05<x<0.2$. In certain embodiments, $0.1\leq x\leq0.15$. In certain embodiments, x is from about 0.10 to about 0.12.

In certain embodiments, a first semiconductor material comprising cadmium, zinc and sulfur can further comprise one or more additional chemical elements. Non-limiting examples of include compositions represented by the general formula MA wherein M comprises cadmium, zinc and optionally one or more additional different chemical elements and A comprises sulfur and optionally one or more additional chemical elements. In certain examples, M can optionally further comprise one or more additional elements from Group IA (for example, lithium, sodium, rubidium, and cesium), Group IIA (for example, beryllium, magnesium, calcium, strontium, and barium), Group IIB (for example, Zn, Cd, and Hg), Group IIIA (for example, B, Al, Ga, In, and Tl), Group IVA (for example, Si, Ge, Sn, and Pb), or the transition metals (for example, Ti, Zr, Hf, V, Nb, Ta, Cr, Mo, W, Mn, Tc, Re, Fe, Co, Ni, Pd, Pt, Rh, and the like). (See, F. A. Cotton et al., Advanced Inorganic Chemistry, 6th Edition, (1999). In certain examples, A comprises sulfur and optionally one or more additional elements selected from Group VA (for example, nitrogen, phosphorus, arsenic, antimony, and bismuth) and/or Group VIA (for example, oxygen, sulfur, selenium, and tellurium). Other semiconductor materials suitable for inclusion in the core can be used.

In certain embodiments, the first semiconductor material does not include an element from Group IIA.

In certain embodiments of the invention, the core can comprise an alloy of three or more chemical elements.

In certain embodiments, the core can comprise a homogeneous alloy of the three or more chemical elements.

Non-limiting examples of second semiconductor materials are described above and in the detailed description.

In certain embodiments, the second semiconductor material comprises zinc and sulfur. In certain embodiments, the second semiconductor material comprises ZnS.

In certain embodiments, the shell can comprise an alloy of three or more chemical elements.

In certain embodiments, the shell can comprise a homogeneous alloy of three or more chemical elements.

In certain embodiments, the first semiconductor material comprises $Zn_xCd_{1-x}S$, wherein $0<x<1$ and the second semiconductor material comprises ZnS.

In certain embodiments, the semiconductor nanocrystal is capable of emitting light with a photoluminescence quantum efficiency greater than about 65% upon excitation.

In certain embodiments, the semiconductor nanocrystal is capable of emitting light with a photoluminescence quantum efficiency greater than about 70% upon excitation.

In certain embodiments, the semiconductor nanocrystal is capable of emitting light with a photoluminescence quantum efficiency greater than about 80% upon excitation.

In certain embodiments, the semiconductor nanocrystal is capable of emitting light with a photoluminescence quantum efficiency greater than about 90% upon excitation.

In certain embodiments, the semiconductor nanocrystal is capable of emitting light with a photoluminescence quantum efficiency greater than about 95% upon excitation.

In certain embodiments, the semiconductor nanocrystal is capable of emitting light with a photoluminescence quantum efficiency of about 100% upon excitation.

In certain embodiments, the light includes a maximum peak emission with a full width at half maximum of not more than 50 nm, not more than 40 nm, not more than 30 nm, or not more than 20 nm.

In certain embodiments, the semiconductor nanocrystal is capable of emitting blue light.

In certain embodiments, the semiconductor nanocrystal is capable of emitting light including a maximum peak emission at a wavelength not greater than about 470 nm.

In certain embodiments, the semiconductor nanocrystal is capable of emitting light including a maximum peak emission at a wavelength not greater than about 480 nm.

In certain embodiments, the semiconductor nanocrystal is capable of emitting light including a maximum peak emission at a wavelength not greater than about 490 nm.

In accordance with a further aspect of the invention there is provided a semiconductor nanocrystal including a core comprising a first semiconductor material comprising at least three chemical elements and a shell disposed over at least a portion of the core, the shell comprising a second semiconductor material comprising at least three chemical elements, wherein the semiconductor nanocrystal is capable of emitting light with a photoluminescence quantum efficiency greater than about 60% upon excitation.

In certain embodiments, the light includes a maximum peak emission having a full width at half maximum of not more than 50 nm, not more than 40 nm, or not more than 30 nm.

In certain embodiments, the light can include a maximum peak emission at a wavelength in a predetermined range.

In certain embodiments, the light can include a maximum peak emission at a predetermined peak wavelength.

Non-limiting examples of first and second semiconductor materials comprising at least three chemical elements include compositions represented by the general formula MA wherein M comprises at least two different chemical elements and A comprises at least one chemical element or wherein M comprises at least one chemical element and A comprises at least two different chemical elements. In certain examples, M comprises one or more elements from Group IA (for example, lithium, sodium, rubidium, and cesium. Group), IIA (for example, beryllium, magnesium, calcium, strontium, and barium), Group IIB (for example, Zn, Cd, and Hg), Group IIIA (for example, B, Al, Ga, In, and Tl), Group IVA (for example, Si, Ge, Sn and Pb), or the transition metals (for example, Ti, Zr, Hf, V, Nb, Ta, Cr, Mo, W, Mn, Tc, Re, Fe, Co, Ni, Pd, Pt, Rh, and the like). (See, F. A. Cotton et al., Advanced Inorganic Chemistry, 6th Edition, (1999). In certain examples, A comprises one or more elements selected from Group VA (for example, nitrogen, phosphorus, arsenic, antimony, and bismuth) and/or Group VIA (for example, oxygen, sulfur, selenium, and tellurium).

In certain embodiments, M is selected form Group IIA and/or Group IIB and A is selected from Group VIA.

In certain embodiments, M is selected from Group IIA and/or Group IIB and A is selected from Group VA.

In certain other embodiments, M is selected from Group IIIA and A is selected from Group VA.

In certain embodiments, M is selected from Group IVA and A is selected from Group VIA.

In certain embodiments, M is selected from Group IA and/or Group IIIA and A is selected from Group VIA.

In certain embodiments, M is selected from Group IIA and/or Group IVA and A is selected from Group VA.

In certain embodiments, the first semiconductor material comprises zinc, cadmium, and selenium.

In certain embodiments, the first semiconductor material comprises $Zn_{1-x}Cd_xSe$, wherein $0<x<1$.

In certain other embodiments, the second semiconductor material comprises zinc, cadmium, and sulfur.

In certain embodiments, the second semiconductor material comprises $Cd_xZn_{1-x}S$ wherein $0<x<1$. In certain more detailed embodiments, the first semiconductor material can comprise $Zn_{1-x}Cd_xSe$, wherein $0<x<1$, and the second semiconductor material can comprise $Cd_xZn_{1-x}S$ wherein $0<x<$ In accordance with one aspect of the invention there is provided a semiconductor nanocrystal including a core comprising a first semiconductor material comprising cadmium, zinc and selenium and a shell disposed over at least a portion of the core, the shell comprising a second semiconductor material, wherein the semiconductor nanocrystal is capable of emitting light with a photoluminescence quantum efficiency greater than about 60% upon excitation.

In certain embodiments, the first semiconductor material comprises $Zn_{1-x}Cd_xSe$, wherein $0<x<1$. In certain embodiments, $0<x\leq0.5$. In certain embodiments, $0<x\leq0.3$.

In certain embodiments, first semiconductor material comprising zinc, cadmium, and selenium can further comprise one or more additional chemical elements.

Non-limiting examples of first semiconductor materials include compositions represented by the general formula MA wherein M comprises cadmium, zinc and optionally one or more additional different chemical elements and A comprises sulfur and optionally one or more additional chemical elements. In certain examples, M can optionally further comprise one or more elements from Group IA (for example, lithium, sodium, rubidium, and cesium), Group IIA (for example, beryllium, magnesium, calcium, strontium, and barium), Group IIB (for example, Zn, Cd, and Hg), Group IIIA (for example, B, Al, Ga, In, and Tl), Group IVA (for example, Si, Ge, Sn and Pb), or the transition metals (for example, Ti, Zr, Hf, V, Nb, Ta, Cr, Mo, W, Mn, Tc, Re, Fe, Co, Ni, Pd, Pt, Rh, and the like). (See, F. A. Cotton et al., Advanced Inorganic Chemistry, 6th Edition, (1999). In certain examples, A comprises selenium and optionally one or more additional elements selected from Group VA (for example, nitrogen, phosphorus, arsenic, antimony, and bismuth) and/or Group VIA (for example, oxygen, sulfur, selenium, and tellurium). Other semiconductor materials suitable for inclusion in the core are described in the detailed description.

In certain embodiments of the invention, the core can comprise an alloy of three or more chemical elements.

In certain embodiments, the core can comprise a homogeneous alloy of the three or more chemical elements.

Non-limiting examples of first semiconductor materials are described above and in the detailed description.

The shell comprises a second semiconductor material. A second semiconductor material can comprise one or more chemical elements. Non-limiting examples of second semiconductor materials including two or more chemical elements include compositions represented by the general formula M'A' wherein M' comprises at least one chemical elements and A' comprises at least one chemical element. In certain examples, M' comprises one or more elements from Group IA (for example, lithium, sodium, rubidium, and cesium), Group IIB (for example, Zn, Cd, and Hg), Group IIIA (for example, B, Al, Ga, In, and Tl), Group IVA (for example, Si, Ge, Sn and Pb), or the transition metals (for example, Ti, Zr, Hf, V, Nb, Ta, Cr, Mo, W, Mn, Tc, Re, Fe, Co, Ni, Pd, Pt, Rh, and the like). (See, F. A. Cotton et al., Advanced Inorganic Chemistry, 6th Edition, (1999). In certain examples, A' comprises one or more elements selected from Group VA (for example, nitrogen, phosphorus, arsenic, antimony, and bismuth) and/or Group VIA (for example, oxygen, sulfur, selenium, and tellurium). Other semiconductor materials suitable for inclusion in the shell are described in the detailed description. The second semiconductor material is preferably an inorganic semiconductor material.

In certain embodiments, M' comprises one or more chemical elements from Group IIB and A' comprises one or more chemical elements from Group VIA.

In certain embodiments, M' comprises one or more chemical elements from Group IIB and A' comprises one or more chemical elements from Group VA.

In certain other embodiments, M' comprises one or more chemical elements from Group IIIA and A' comprises one or more chemical elements from Group VA.

In certain embodiments, M' comprises one or more chemical elements from Group IVA and A' comprises one or more chemical elements from Group VIA.

In certain embodiments, M' comprises one or more chemical elements from Group IA and/or Group IIIA and A' comprises one or more chemical elements from Group VIA.

In certain embodiments, M' comprises one or more chemical elements from Group IVA and A' comprises one or more chemical elements from Group VA.

In certain embodiments, the second semiconductor material comprises one or more chemical elements.

In certain embodiments, the second semiconductor material comprises two or more chemical elements.

In certain embodiments, the second semiconductor material comprises three or more chemical elements.

In certain embodiments, the second semiconductor material comprises cadmium, zinc and sulfur. In certain embodiments, the second semiconductor material comprises $Cd_xZn_{1-x}S$, wherein $0<x<1$.

In certain embodiments of the invention, the shell can comprise an alloy of three or more chemical elements.

In certain embodiments, the shell can comprise a homogeneous alloy of three or more chemical elements.

In certain embodiments, the first semiconductor material comprises $Zn_{1-x}Cd_xSe$, wherein $0<x<1$ and the second semiconductor material comprises $Cd_xZn_{1-x}S$, wherein $0<x<1$.

In certain embodiments, the light includes a maximum peak emission with a full width at half maximum of not more than 50 nm, not more than 40 nm, or not more than 30 nm.

In certain embodiments, the semiconductor nanocrystal is capable of light including an emission in the blue region of the spectrum.

In certain embodiments, the semiconductor nanocrystal is capable of emitting light including a maximum peak emission having a wavelength not greater than 470 nm.

In accordance with another aspect of the invention, there is provided a population of semiconductor nanocrystals, wherein each nanocrystal of the population comprises a semiconductor nanocrystal including a core comprising a first semiconductor material comprising at least three chemical elements and a shell disposed over at least a portion of the core, the shell comprising a second semiconductor material, wherein the population is capable of emitting light with a photoluminescence quantum efficiency greater than about 65% upon excitation.

Examples of first semiconductor materials including at least three chemical elements and second semiconductor materials are described above and in the detailed description.

In certain embodiments, the first semiconductor material comprises zinc, cadmium, and sulfur.

In certain embodiments, a first semiconductor material comprises $Zn_xCd_{1-x}S$, wherein $0<x<1$. In certain embodiments, $0<x\leq0.5$. In certain embodiments, $0<x\leq0.3$. In certain embodiments, $0.05<x<0.2$. In certain embodiments, $0.1\leq x\leq0.15$. In certain embodiments, x is from about 0.10 to about 0.12.

In certain embodiments, the first semiconductor material comprises zinc, cadmium, and selenium.

In certain embodiments, the first semiconductor material comprises $Zn_{1-x}Cd_xSe$, wherein $0<x<1$.

In certain embodiments, the core can comprise an alloy of three or more chemical elements.

In certain embodiments, the core can comprise a homogeneous alloy of the three or more chemical element.

The shell comprises a second semiconductor material. A second semiconductor material can comprise one or more chemical elements. Non-limiting examples of a second semiconductor material are described above and in the detailed description.

In certain embodiments, the second semiconductor material comprises zinc and sulfur. In certain embodiments, the second semiconductor material comprises ZnS.

In certain embodiments, the shell can comprise an alloy of three or more chemical elements.

In certain embodiments, the shell can comprise a homogeneous alloy of three or more chemical elements.

In certain embodiments, the first semiconductor material comprises $Zn_xCd_{1-x}S$, wherein $0<x<1$ and the second semiconductor material comprises ZnS.

In certain other embodiments, the second semiconductor material comprises zinc, cadmium, and sulfur.

In certain embodiments, the second semiconductor material comprises $Cd_xZn_{1-x}S$ wherein $0<x<1$. In certain more detailed embodiments, the first semiconductor material can comprise $Zn_{1-x}Cd_xSe$, wherein $0<x<1$, and the second semiconductor material can comprise $Cd_xZn_{1-x}S$ wherein $0<x<1$.

In certain embodiments, a shell comprising $Cd_xZn_{1-x}S$ wherein $0<x<1$ is obtainable by a process comprising adding Cd-precursor, Zn-precursor, and S-precursor to a nanocrystal core and subsequently adding additional Zn-precursor and S-precursor thereto.

In certain embodiments, the Cd-precursor, Zn-precursor, and S-precursor are admixed with nanocrystal cores at a temperature sufficient to induce formation of shell material on at least a portion of the surfaces of at least a portion of the cores. The subsequently added additional amounts of Zn-precursor and S-precursor are admixed with the nanocrystal cores to which the Cd-precursor, Zn-precursor, and S-precursor has been previously added. Preferably the temperature of the admixture to which additional Zn-precursor and S-precursor are added is at a temperature sufficient to induce formation of additional shell material on at least a portion of the surfaces of at least a portion of the cores including shell material.

The population is capable of emitting light with a photoluminescence quantum efficiency greater than about 65% upon excitation.

In certain embodiments, the population is capable of emitting light with a photoluminescence quantum efficiency greater than about 70% upon excitation.

In certain embodiments, the population is capable of emitting light with a photoluminescence quantum efficiency greater than about 80% upon excitation.

In certain embodiments, the population is capable of emitting light with a photoluminescence quantum efficiency greater than about 90% upon excitation.

In certain embodiments, the population is capable of emitting light with a photoluminescence quantum efficiency greater than about 95% upon excitation.

In certain embodiments, the population is capable of emitting light with a photoluminescence quantum efficiency of about 100% upon excitation.

In certain embodiments, the light includes a maximum peak emission with a full width at half maximum of not more than 50 nm, not more than 40 nm, not more than 30 nm, or not more than 20 nm.

In accordance with another aspect of the invention, there is provided a population of semiconductor nanocrystals, wherein the population comprises a plurality of semiconductor nanocrystal including a core comprising a first semiconductor material comprising cadmium, zinc and sulfur and a shell disposed over at least a portion of the core, the shell comprising a second semiconductor material.

Non-limiting examples of first semiconductor materials comprising cadmium, zinc, and sulfur are described above and in the detailed description.

In certain embodiments, a first semiconductor material comprises $Zn_xCd_{1-x}S$, wherein $0<x<1$. In certain embodiments, $0<x\leq0.5$. In certain embodiments, $0<x\leq0.3$. In certain embodiments, $0.05<x<0.2$. In certain embodiments, $0.1\leq x\leq0.15$. In certain embodiments, x is from about 0.10 to about 0.12.

In certain embodiments of the invention, the core can comprise an alloy of three or more chemical elements.

In certain embodiments, the core can comprise a homogeneous alloy of the three or more chemical elements.

Non-limiting examples of second semiconductor materials are described above and in the detailed description.

In certain embodiments, the second semiconductor material comprises zinc and sulfur. In certain embodiments, the second semiconductor material comprises ZnS.

In certain embodiments, the shell can comprise an alloy of three or more chemical elements.

In certain embodiments, the shell can comprise a homogeneous alloy of three or more chemical elements.

In certain embodiments, the first semiconductor material comprises $Zn_xCd_{1-x}S$, wherein $0<x<1$ and the second semiconductor material comprises ZnS.

The population is capable of emitting light with a photoluminescence quantum efficiency greater than about 65% upon excitation.

In certain embodiments, the semiconductor nanocrystal is capable of emitting light with a photoluminescence quantum efficiency greater than about 70% upon excitation.

In certain embodiments, the semiconductor nanocrystal is capable of emitting light with a photoluminescence quantum efficiency greater than about 80% upon excitation.

In certain embodiments, the semiconductor nanocrystal is capable of emitting light with a photoluminescence quantum efficiency greater than about 90% upon excitation.

In certain embodiments, the semiconductor nanocrystal is capable of emitting light with a photoluminescence quantum efficiency greater than about 95% upon excitation.

In certain embodiments, the semiconductor nanocrystal is capable of emitting light with a photoluminescence quantum efficiency of about 100% upon excitation.

In certain embodiments, the light includes a maximum peak emission with a full width at half maximum of not more than 50 nm, not more than 40 nm, not more than 30 nm, or not more than 20 nm.

In certain embodiments, the population of semiconductor nanocrystals is capable of emitting blue light.

In certain embodiments, the population of semiconductor nanocrystals is capable of emitting light including a maximum peak emission at a wavelength not greater than about 470 nm.

In certain embodiments, the population of semiconductor nanocrystals is capable of emitting light including a maximum peak emission at a wavelength not greater than about 480 nm.

In certain embodiments, the population of semiconductor nanocrystals is capable of emitting light including a maximum peak emission at a wavelength not greater than about 490 nm.

In accordance with another aspect of the invention, there is provided a population of semiconductor nanocrystals, wherein each nanocrystal of the population comprises a core comprising a first semiconductor material comprising at least three chemical elements and a shell disposed over at least a portion of the core, the shell comprising a second semiconductor material comprising at least three chemical elements, wherein the population is capable of emitting light with a photoluminescence quantum efficiency of greater than about 60%.

In certain embodiments, the light includes a maximum peak emission having a full width at half maximum of not more than 50 nm, not more than 40 nm, or not more than 30 nm.

In certain embodiments, the light can include a maximum peak emission at a wavelength in a predetermined range.

In certain embodiments, the light can include a maximum peak emission at a predetermined peak wavelength.

Non-limiting examples of first and second semiconductor materials comprising at least three chemical elements are described above and in the detailed description.

In certain embodiments, the first semiconductor material comprises zinc, cadmium, and selenium.

In certain embodiments, the first semiconductor material comprises $Zn_{1-x}Cd_xSe$, wherein $0<x<1$.

In certain other embodiments, the second semiconductor material comprises zinc, cadmium, and sulfur.

In certain embodiments, the second semiconductor material comprises $Cd_xZn_{1-x}S$ wherein $0<x<1$. In certain more detailed embodiments, the first semiconductor material can comprise $Zn_{1-x}Cd_xSe$, wherein $0<x<1$, and the second semiconductor material can comprise $Cd_xZn_{1-x}S$ wherein $0<x<1$.

In accordance with another aspect of the invention, there is provided a population of semiconductor nanocrystals, wherein each nanocrystal of the population comprises a semiconductor nanocrystal including a core comprising a first semiconductor material comprising cadmium, zinc and selenium and a shell disposed over at least a portion of the core, the shell comprising a second semiconductor material, wherein the semiconductor nanocrystal is capable of emitting light with a photoluminescence quantum efficiency greater than about 60% upon excitation.

Non-limiting examples of a first material comprising cadmium, zinc, and selenium are described above and in the detailed description.

In certain embodiments, the first semiconductor material comprises $Zn_{1-x}Cd_xSe$, wherein $0<x<1$. In certain embodiments, $0<x\leq0.5$. In certain embodiments, $0<x\leq0.3$.

In certain embodiments of the invention, the core can comprise an alloy of three or more chemical elements.

In certain embodiments, the core can comprise a homogeneous alloy of the three or more chemical elements.

Non-limiting examples of second semiconductor materials are described above and in the detailed description.

In certain embodiments, the second semiconductor material comprises one or more chemical elements.

In certain embodiments, the second semiconductor material comprises two or more chemical elements.

In certain embodiments, the second semiconductor material comprises three or more chemical elements.

In certain embodiments, the second semiconductor material comprises cadmium, zinc and sulfur. In certain embodiments, the second semiconductor material comprises $Cd_xZn_{1-x}S$, wherein $0<x<1$.

In certain embodiments of the invention, the shell can comprise an alloy of three or more chemical elements.

In certain embodiments, the shell can comprise a homogeneous alloy of three or more chemical elements.

In certain embodiments, the first semiconductor material comprises $Zn_{1-x}Cd_xSe$, wherein $0<x<1$ and the second semiconductor material comprises $Cd_xZn_{1-x}S$, wherein $0<x<1$.

In certain embodiments, the light includes a maximum peak emission with a full width at half maximum of not more than 50 nm, not more than 40 nm, or not more than 30 nm.

In certain embodiments, the population of semiconductor nanocrystals is capable of emitting light including a maximum peak emission in the blue region of the spectrum.

In certain embodiments, the population of semiconductor nanocrystals is capable of emitting light including a maximum peak emission having a wavelength not greater than 470 nm.

In certain embodiments, the population of semiconductor nanocrystals is capable of emitting light including a maximum peak emission having a wavelength not greater than 480 nm.

In certain embodiments, the population of semiconductor nanocrystals is capable of emitting light including a maximum peak emission having a wavelength not greater than 490 nm. In still a further aspect of the present invention there is provided a composition including a semiconductor nanocrystal including a core comprising a first semiconductor material comprising at least three chemical elements and a shell disposed over at least a portion of the core, the shell comprising a second semiconductor material, wherein the semiconductor nanocrystal is capable of emitting light with a photoluminescence quantum efficiency greater than about 65% upon excitation.

Examples of first semiconductor materials including at least three chemical elements and second semiconductor materials are described above and in the detailed description.

In certain embodiments, the first semiconductor material comprises zinc, cadmium, and sulfur.

In certain embodiments, a first semiconductor material comprises $Zn_xCd_{1-x}S$, wherein $0<x<1$. In certain embodiments, $0<x\leq0.5$. In certain embodiments, $0<x\leq0.3$. In certain embodiments, $0.05<x<0.2$. In certain embodiments, $0.1\leq x\leq0.15$. In certain embodiments, x is from about 0.10 to about 0.12.

In certain embodiments, the first semiconductor material comprises zinc, cadmium, and selenium.

In certain embodiments, the first semiconductor material comprises $Zn_{1-x}Cd_xSe$, wherein $0<x<1$.

In certain embodiments, the core can comprise an alloy of three or more chemical elements.

In certain embodiments, the core can comprise a homogeneous alloy of the three or more chemical element.

The shell comprises a second semiconductor material. A second semiconductor material can comprise one or more chemical elements. Non-limiting examples of a second semiconductor material are described above and in the detailed description.

In certain embodiments, the second semiconductor material comprises zinc and sulfur. In certain embodiments, the second semiconductor material comprises ZnS.

In certain embodiments, the shell can comprise an alloy of three or more chemical elements.

In certain embodiments, the shell can comprise a homogeneous alloy of three or more chemical elements.

In certain embodiments, the first semiconductor material comprises $Zn_xCd_{1-x}S$, wherein $0<x<1$ and the second semiconductor material comprises ZnS.

In certain other embodiments, the second semiconductor material comprises zinc, cadmium, and sulfur.

In certain embodiments, the second semiconductor material comprises $Cd_xZn_{1-x}S$ wherein $0<x<1$. In certain more detailed embodiments, the first semiconductor material can comprise $Zn_{1-x}Cd_xSe$, wherein $0<x<1$, and the second semiconductor material can comprise $Cd_xZn_{1-x}S$ wherein $0<x<1$.

In certain embodiments, the semiconductor nanocrystal is capable of emitting light with a photoluminescence quantum efficiency greater than about 70% upon excitation.

In certain embodiments, the semiconductor nanocrystal is capable of emitting light with a photoluminescence quantum efficiency greater than about 80% upon excitation.

In certain embodiments, the semiconductor nanocrystal is capable of emitting light with a photoluminescence quantum efficiency greater than about 90% upon excitation.

In certain embodiments, the semiconductor nanocrystal is capable of emitting light with a photoluminescence quantum efficiency greater than about 95% upon excitation.

In certain embodiments, the semiconductor nanocrystal is capable of emitting light with a photoluminescence quantum efficiency of about 100% upon excitation.

In certain embodiments, the light includes a maximum peak emission with a full width at half maximum of not more than 50 nm, not more than 40 nm, not more than 30 nm, or not more than 20 nm.

In still a further aspect of the present invention there is provided a composition including a semiconductor nanocrystal including a core comprising a first semiconductor material comprising cadmium, zinc and sulfur and a shell disposed over at least a portion of the core, the shell comprising a second semiconductor material.

Non-limiting examples of first semiconductor materials comprising cadmium, zinc, and sulfur are described above and in the detailed description.

In certain embodiments, a first semiconductor material comprises $Zn_xCd_{1-x}S$, wherein $0<x<1$. In certain embodiments, $0<x\leq0.5$. In certain embodiments, $0<x\leq0.3$. In certain embodiments, $0.05<x<0.2$. In certain embodiments, $0.1\leq x\leq0.15$. In certain embodiments, x is from about 0.10 to about 0.12.

In certain embodiments of the invention, the core can comprise an alloy of three or more chemical elements.

In certain embodiments, the core can comprise a homogeneous alloy of the three or more chemical elements.

Non-limiting examples of second semiconductor materials are described above and in the detailed description.

In certain embodiments, the second semiconductor material comprises zinc and sulfur. In certain embodiments, the second semiconductor material comprises ZnS.

In certain embodiments, the shell can comprise an alloy of three or more chemical elements.

In certain embodiments, the shell can comprise a homogeneous alloy of three or more chemical elements.

In certain embodiments, the first semiconductor material comprises $Zn_xCd_{1-x}S$, wherein $0<x<1$ and the second semiconductor material comprises ZnS.

In certain embodiments wherein $x\geq 0.1$, a maximum peak emission at a wavelength not greater than about 470 nm can be obtained.

In certain embodiments of the invention, the core can comprise an alloy of three or more chemical elements.

In certain embodiments, the core can comprise a homogeneous alloy of the three or more chemical elements.

In certain embodiments, the semiconductor nanocrystal is capable of emitting light with a photoluminescence quantum efficiency greater than about 65% upon excitation.

In certain embodiments, the semiconductor nanocrystal is capable of emitting light with a photoluminescence quantum efficiency greater than about 70% upon excitation.

In certain embodiments, the semiconductor nanocrystal is capable of emitting light with a photoluminescence quantum efficiency greater than about 80% upon excitation.

In certain embodiments, the semiconductor nanocrystal is capable of emitting light with a photoluminescence quantum efficiency greater than about 90% upon excitation.

In certain embodiments, the semiconductor nanocrystal is capable of emitting light with a photoluminescence quantum efficiency greater than about 95% upon excitation.

In certain embodiments, the semiconductor nanocrystal is capable of emitting light with a photoluminescence quantum efficiency of about 100% upon excitation.

In certain embodiments, the light includes a maximum peak emission with a full width at half maximum of not more than 50 nm, not more than 40 nm, not more than 30 nm, or not more than 20 nm.

In certain embodiments, the semiconductor nanocrystals are capable of emitting blue light.

In certain embodiments, the semiconductor nanocrystals are capable of emitting light including a maximum peak emission at a wavelength not greater than about 470 nm. In still a further aspect of the present invention there is provided a composition including a semiconductor nanocrystal, semiconductor nanocrystal including a core comprising a first semiconductor material comprising at least three chemical elements and a shell disposed over at least a portion of the core, the shell comprising a second semiconductor material comprising at least three chemical elements, wherein the semiconductor nanocrystal is capable of emitting light with a photoluminescence quantum efficiency of greater than about 60%.

In certain embodiments, the light includes a maximum peak emission having a full width at half maximum of not more than 50 nm, not more than 40 nm, or not more than 30 nm.

In certain embodiments, the light can include a maximum peak emission at a wavelength in a predetermined range.

In certain embodiments, the light can include a maximum peak emission at a predetermined peak wavelength.

Non-limiting examples of first and second semiconductor materials comprising at least three chemical elements are described above and in the detailed description.

In certain embodiments, the first semiconductor material comprises zinc, cadmium, and selenium.

In certain embodiments, the first semiconductor material comprises $Zn_{1-x}Cd_xSe$, wherein $0<x<1$.

In certain other embodiments, the second semiconductor material comprises zinc, cadmium, and sulfur.

In certain embodiments, the second semiconductor material comprises $Cd_xZn_{1-x}S$ wherein $0<x<1$. In certain more detailed embodiments, the first semiconductor material can comprise $Zn_{1-x}Cd_xSe$, wherein $0<x<1$, and the second semiconductor material can comprise $Cd_xZn_{1-x}S$ wherein $0<x<1$.

In still a further aspect of the present invention there is provided a composition including a semiconductor nanocrystal including a core comprising a first semiconductor material comprising cadmium, zinc and selenium and a shell disposed over at least a portion of the core, the shell comprising a second semiconductor material, wherein the semiconductor nanocrystal is capable of emitting light with a photoluminescence quantum efficiency greater than about 60% upon excitation.

Non-limiting examples of a first material comprising cadmium, zinc, and selenium are described above and in the detailed description.

In certain embodiments, the first semiconductor material comprises $Zn_{1-x}Cd_xSe$, wherein $0<x<1$. In certain embodiments, $0<x\leq 0.5$. In certain embodiments, $0<x\leq 0.3$.

In certain embodiments of the invention, the core can comprise an alloy of three or more chemical elements.

In certain embodiments, the core can comprise a homogeneous alloy of the three or more chemical elements.

Non-limiting examples of second semiconductor materials are described above and in the detailed description.

In certain embodiments, the second semiconductor material comprises one or more chemical elements.

In certain embodiments, the second semiconductor material comprises two or more chemical elements.

In certain embodiments, the second semiconductor material comprises three or more chemical elements.

In certain embodiments, the second semiconductor material comprises cadmium, zinc and sulfur. In certain embodiments, the second semiconductor material comprises $Cd_xZn_{1-x}S$, wherein $0<x<1$.

In certain embodiments of the invention, the shell can comprise an alloy of three or more chemical elements.

In certain embodiments, the shell can comprise a homogeneous alloy of three or more chemical elements.

In certain embodiments, the first semiconductor material comprises $Zn_{1-x}Cd_xSe$, wherein $0<x<1$ and the second semiconductor material comprises $Cd_xZn_{1-x}S$, wherein $0<x<1$.

In certain embodiments, the light includes a maximum peak emission with a full width at half maximum of not more than 50 nm, not more than 40 nm, or not more than 30 nm.

In certain embodiments, the semiconductor nanocrystals are capable of emitting blue light including a maximum peak emission in the blue region of the spectrum.

In certain embodiments, the semiconductor nanocrystals are capable of emitting light including a maximum peak emission having a wavelength not greater than 470 nm.

In accordance with various aspects and embodiments of compositions of the present invention, a composition can further include a polymer.

In accordance with various aspects and embodiments of compositions of the present invention, a composition can further include a pre-polymer.

In accordance with various aspects and embodiments of compositions of the present invention, a composition can further include an oligomer.

In accordance with various aspects and embodiments of compositions of the present invention, a composition can further include a small molecule.

In accordance with various aspects and embodiments of compositions of the present invention, a composition can further include an inorganic material.

In accordance with various aspects and embodiments of compositions of the present invention, a composition can comprise a matrix. The matrix can comprise an organic or inorganic material. In certain embodiments of a composition in accordance with the present invention, the semiconductor nanocrystals are dispersed in the matrix. In certain embodiments, the semiconductor nanocrystals are randomly dispersed in the matrix. In certain embodiments, the semiconductor nanocrystals are homogeneously dispersed in the matrix. Non-limiting examples of matrices include, but are not limited to, a polymer (e.g., polystyrene, epoxy, polyimides), a glass (e.g., silica glass), a gel (e.g., a silica gel), and any other material which is at least partially, and preferably fully, transparent to the light emitted by the semiconductor nanocrystals and in which semiconductor nanocrystals can be included. Depending on the use of the composition, the matrix can be conductive or non-conductive. Examples of preferred matrices include, but are not limited to, glass or a resin. Resins can be non-curable resins, heat-curable resins, or photocurable resins. More specific examples of resins can be in the form of either an oligomer or a polymer, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like. Examples of a photo-polymerizable resin include an acrylic acid or methacrylic acid based resin containing a reactive vinyl group, a photo-crosslinkable resin which generally contains a photo-sensitizer, such as polyvinyl cinnamate, or the like. A heat-curable resin may selected when the photo-sensitizer is not used. Matrix resins may be used individually or in combination of two or more. Other matrix materials can be readily identified by one of ordinary skill in the art. In certain embodiments, a composition including a matrix may further include scatterers (e.g, without limitation, metal or metal oxide particles, air bubbles, and glass and polymeric beads (solid or hollow), and/or other optional additives typically used in the desired end-use application for the composition.

In accordance with various aspects and embodiments of compositions of the present invention, a composition can further include a liquid medium. In certain embodiments, compositions in accordance with the present invention including a liquid medium comprise an ink. Examples of suitable liquids and other optional additives that may be included in an ink are described in International Application No. PCT/US2007/00873 of Seth Coe-Sullivan et al., for "Composition Including Material, Methods Of Depositing Material, Articles Including Same And Systems For Deposition Material", filed 9 Apr. 2007, and International Application No. PCT/US2007/014711 of Seth Coe-Sullivan et al., for "Methods For Depositing Nanomaterial, Methods For Fabricating A device, And Methods For Fabricating An Array Of Devices", filed 25 Jun. 2007, which are each hereby incorporated herein by reference in their entireties.

In accordance with various aspects and embodiments of compositions of the present invention, a composition can further include a non-polar liquid in which the semiconductor nanocrystal is dispersible.

In accordance with various aspects and embodiments of compositions of the present invention, a composition can further include a polar liquid in which the semiconductor nanocrystal is dispersible.

In a still further aspect of the invention there is provided a device including a semiconductor nanocrystal including a core comprising a first semiconductor material comprising at least three chemical elements and a shell disposed over at least a portion of the core, the shell comprising a second semiconductor material, wherein the semiconductor nanocrystal is capable of emitting light with a photoluminescence quantum efficiency greater than about 65% upon excitation.

Examples of first semiconductor materials including at least three chemical elements and second semiconductor materials are described above and in the detailed description.

In certain embodiments, the first semiconductor material comprises zinc, cadmium, and sulfur.

In certain embodiments, a first semiconductor material comprises $Zn_xCd_{1-x}S$, wherein $0<x<1$. In certain embodiments, $0<x\leq0.5$. In certain embodiments, $0<x\leq0.3$. In certain embodiments, $0.05<x<0.2$. In certain embodiments, $0.1\leq x\leq 0.15$ In certain embodiments, x is from about 0.10 to about 0.12.

In certain embodiments, the first semiconductor material comprises zinc, cadmium, and selenium.

In certain embodiments, the first semiconductor material comprises $Zn_{1-x}Cd_xSe$, wherein $0<x<1$.

In certain embodiments, the core can comprise an alloy of three or more chemical elements.

In certain embodiments, the core can comprise a homogeneous alloy of the three or more chemical element.

The shell comprises a second semiconductor material. A second semiconductor material can comprise one or more chemical elements. Non-limiting examples of a second semiconductor material are described above and in the detailed description.

In certain embodiments, the second semiconductor material comprises zinc and sulfur. In certain embodiments, the second semiconductor material comprises ZnS.

In certain embodiments, the shell can comprise an alloy of three or more chemical elements.

In certain embodiments, the shell can comprise a homogeneous alloy of three or more chemical elements.

In certain embodiments, the first semiconductor material comprises $Zn_xCd_{1-x}S$, wherein $0<x<1$ and the second semiconductor material comprises ZnS.

In certain other embodiments, the second semiconductor material comprises zinc, cadmium, and sulfur.

In certain embodiments, the second semiconductor material comprises $Cd_xZn_{1-x}S$ wherein $0<x<1$. In certain more detailed embodiments, the first semiconductor material can comprise $Zn_{1-x}Cd_xSe$, wherein $0<x<1$, and the second semiconductor material can comprise $Cd_xZn_{1-x}S$ wherein $0<x<1$.

In certain embodiments, the semiconductor nanocrystal is capable of emitting blue light with a photoluminescence quantum efficiency greater than about 70% upon excitation.

In certain embodiments, the semiconductor nanocrystal is capable of emitting light with a photoluminescence quantum efficiency greater than about 80% upon excitation.

In certain embodiments, the semiconductor nanocrystal is capable of emitting light with a photoluminescence quantum efficiency greater than about 90% upon excitation.

In certain embodiments, the semiconductor nanocrystal is capable of emitting light with a photoluminescence quantum efficiency greater than about 95% upon excitation.

In certain embodiments, the semiconductor nanocrystal is capable of emitting light with a photoluminescence quantum efficiency of about 100% upon excitation.

In certain embodiments, the light includes a maximum peak emission with a full width at half maximum of not more than 50 nm, not more than 40 nm, not more than 30 nm, or not more than 20 nm.

In certain embodiments, a device comprises a layer comprising a plurality of semiconductor nanocrystals and means for exciting the semiconductor nanocrystals, wherein the plurality of semiconductor nanocrystals include one or more semiconductor nanocrystals including a core comprising a first semiconductor material comprising at least three chemical elements and a shell disposed over at least a portion of the core, the shell comprising a second semiconductor material, wherein the semiconductor nanocrystal is capable of emitting light with a photoluminescence quantum efficiency greater than about 65% upon excitation. The layer can be continuous or non-continuous. The layer can be patterned or unpatterned.

In a still further aspect of the invention there is provided a device including a semiconductor nanocrystal including a core comprising a first semiconductor material comprising cadmium, zinc and sulfur and a shell disposed over at least a portion of the core, the shell comprising a second semiconductor material.

Non-limiting examples of first semiconductor materials comprising cadmium, zinc, and sulfur are described above and in the detailed description.

In certain embodiments, a first semiconductor material comprises $Zn_xCd_{1-x}S$, wherein $0<x<1$. In certain embodiments, $0<x\leq0.5$. In certain embodiments, $0<x\leq0.3$. In certain embodiments, $0.05<x<0.2$. In certain embodiments, $0.1\leq x\leq0.15$ In certain embodiments, x is from about 0.10 to about 0.12.

In certain embodiments of the invention, the core can comprise an alloy of three or more chemical elements.

In certain embodiments, the core can comprise a homogeneous alloy of the three or more chemical elements.

Non-limiting examples of second semiconductor materials are described above and in the detailed description.

In certain embodiments, the second semiconductor material comprises zinc and sulfur. In certain embodiments, the second semiconductor material comprises ZnS.

In certain embodiments, the shell can comprise an alloy of three or more chemical elements.

In certain embodiments, the shell can comprise a homogeneous alloy of three or more chemical elements.

In certain embodiments, the first semiconductor material comprises $Zn_xCd_{1-x}S$, wherein $0<x<1$ and the second semiconductor material comprises ZnS.

In certain embodiments wherein $x\geq0.1$, a maximum peak emission at a wavelength not greater than about 470 nm can be obtained.

In certain embodiments of the invention, the core can comprise an alloy of three or more chemical elements.

In certain embodiments, the core can comprise a homogeneous alloy of the three or more chemical elements.

In certain embodiments, the semiconductor nanocrystal is capable of emitting light with a photoluminescence quantum efficiency greater than about 65% upon excitation.

In certain embodiments, the semiconductor nanocrystal is capable of emitting light with a photoluminescence quantum efficiency greater than about 70% upon excitation.

In certain embodiments, the semiconductor nanocrystal is capable of emitting light with a photoluminescence quantum efficiency greater than about 80% upon excitation.

In certain embodiments, the semiconductor nanocrystal is capable of emitting light with a photoluminescence quantum efficiency greater than about 90% upon excitation.

In certain embodiments, the semiconductor nanocrystal is capable of emitting light with a photoluminescence quantum efficiency greater than about 95% upon excitation.

In certain embodiments, the semiconductor nanocrystal is capable of emitting light with a photoluminescence quantum efficiency of about 100% upon excitation.

In certain embodiments, the light includes a maximum peak emission with a full width at half maximum of not more than 50 nm, not more than 40 nm, not more than 30 nm, or not more than 20 nm.

In certain embodiments, the semiconductor nanocrystal is capable of emitting blue light.

In certain embodiments, the semiconductor nanocrystal is capable of emitting light including a maximum peak emission at a wavelength not greater than about 470 nm.

In certain embodiments, a device comprises a layer comprising a plurality of semiconductor nanocrystals and means for exciting the semiconductor nanocrystals, wherein the plurality of semiconductor nanocrystals include one or more semiconductor nanocrystals including a core comprising a first semiconductor material comprising cadmium, zinc and sulfur and a shell disposed over at least a portion of the core, the shell comprising a second semiconductor material. The layer can be continuous or non-continuous. The layer can be patterned or unpatterned.

In a still further aspect of the invention there is provided a device including a semiconductor nanocrystal comprising a core comprising a first semiconductor material comprising at least three chemical elements and a shell disposed over at least a portion of the core, the shell comprising a second semiconductor material comprising at least three chemical elements, wherein the semiconductor nanocrystal is capable of emitting light with a photoluminescence quantum efficiency of greater than about 60%.

In certain embodiments, the light includes a maximum peak emission having a full width at half maximum of not more than 50 nm, not more than 40 nm, or not more than 30 nm.

In certain embodiments, the light can include a maximum peak emission at a wavelength in a predetermined range.

In certain embodiments, the light can include a maximum peak emission at a predetermined peak wavelength.

Non-limiting examples of first and second semiconductor materials comprising at least three chemical elements are described above and in the detailed description.

In certain embodiments, the first semiconductor material comprises zinc, cadmium, and selenium.

In certain embodiments, the first semiconductor material comprises $Zn_{1-x}Cd_xSe$, wherein $0<x<1$.

In certain other embodiments, the second semiconductor material comprises zinc, cadmium, and sulfur.

In certain embodiments, the second semiconductor material comprises $Cd_xZn_{1-x}S$ wherein $0<x<1$. In certain more detailed embodiments, the first semiconductor material can comprise $Zn_{1-x}Cd_xSe$, wherein $0<x<1$, and the second semiconductor material can comprise $Cd_xZn_{1-x}S$ wherein $0<x<1$.

In certain embodiments, the light includes a maximum peak emission having a full width at half maximum of not more than 50 nm, not more than 40 nm, or not more than 30 nm.

In certain embodiments, the light can include a maximum peak emission at a wavelength in a predetermined range.

In certain embodiments, the light can include a maximum peak emission at a predetermined peak wavelength.

In certain embodiments, a device comprises a layer comprising a plurality of semiconductor nanocrystals and means for exciting the semiconductor nanocrystals, wherein at least a portion of the semiconductor nanocrystals comprise a core comprising a first semiconductor material comprising at least three chemical elements and a shell disposed over at least a portion of the core, the shell comprising a second semiconductor material comprising at least three chemical elements, wherein the semiconductor nanocrystal is capable of emitting light with a photoluminescence quantum efficiency of greater than about 60%.

In a still further aspect of the invention, there is provided a device including a semiconductor nanocrystal including a core comprising a first semiconductor material comprising cadmium, zinc and selenium and a shell disposed over at least a portion of the core, the shell comprising a second semiconductor material, wherein the semiconductor nanocrystal is capable of emitting light with a photoluminescence quantum efficiency greater than about 60% upon excitation.

Non-limiting examples of a first material comprising cadmium, zinc, and selenium are described above and in the detailed description.

In certain embodiments, the first semiconductor material comprises $Zn_{1-x}Cd_xSe$, wherein $0<x<1$. In certain embodiments, $0<x\leq0.5$. In certain embodiments, $0<x\leq0.3$.

In certain embodiments of the invention, the core can comprise an alloy of three or more chemical elements.

In certain embodiments, the core can comprise a homogeneous alloy of the three or more chemical elements.

Non-limiting examples of second semiconductor materials are described above and in the detailed description.

In certain embodiments, the second semiconductor material comprises one or more chemical elements.

In certain embodiments, the second semiconductor material comprises two or more chemical elements.

In certain embodiments, the second semiconductor material comprises three or more chemical elements.

In certain embodiments, the second semiconductor material comprises cadmium, zinc and sulfur. In certain embodiments, the second semiconductor material comprises $Cd_xZn_{1-x}S$, wherein $0<x<1$.

In certain embodiments of the invention, the shell can comprise an alloy of three or more chemical elements.

In certain embodiments, the shell can comprise a homogeneous alloy of three or more chemical elements.

In certain embodiments, the first semiconductor material comprises $Zn_{1-x}Cd_xSe$, wherein $0<x<1$ and the second semiconductor material comprises $Cd_xZn_{1-x}S$, wherein $0<x<1$.

In certain embodiments, the light includes a maximum peak emission with a full width at half maximum of not more than 50 nm, not more than 40 nm, or not more than 30 nm.

In certain embodiments, the semiconductor nanocrystals are capable of emitting blue light including a maximum peak emission in the blue region of the spectrum.

In certain embodiments, the semiconductor nanocrystals are capable of emitting light including a maximum peak emission having a wavelength not greater than 470 nm.

In certain embodiments, a device comprises a layer comprising a plurality of semiconductor nanocrystals and means for exciting the semiconductor nanocrystals, wherein the plurality of semiconductor nanocrystals include one or more semiconductor nanocrystals including a core comprising a first semiconductor material comprising cadmium, zinc and selenium and a shell disposed over at least a portion of the core, the shell comprising a second semiconductor material, wherein the semiconductor nanocrystal is capable of emitting light with a photoluminescence quantum efficiency greater than about 60% upon excitation. The layer can be continuous or non-continuous. The layer can be patterned or unpatterned.

In accordance with various aspects and embodiments of devices of the present invention, means for exciting the semiconductor nanocrystals comprises a light source.

In accordance with various aspects and embodiments of devices of the present invention, means for exciting the semiconductor nanocrystals comprises a first electrode and a second electrode opposed to the first electrode and the layer comprising semiconductor nanocrystals is disposed between the two electrodes and in electrical communication therewith. In certain embodiments, one of the electrodes can be supported by a substrate (which can be flexible or rigid)

In accordance with various aspects and embodiments of devices of the present invention, means for exciting the semiconductor nanocrystals comprises a first electrode and a second electrode opposed to the first electrode and the layer comprising semiconductor nanocrystals is disposed between the two electrodes and in electrical communication therewith. In certain embodiments, one of the electrodes is supported by a substrate (which can be flexible or rigid). In certain embodiments, the device further includes at least one charge transport layer between the two electrodes. In certain embodiments, two charge transport layers are included, e.g., a hole transport layer and an electron transport layer. In certain embodiments, two charge transport layers, e.g., a hole transport layer and an electron transport layer, and a hole blocking layer are included. In certain other embodiments, additional layers can be included. Charge transport materials, hole blocking materials, and other materials that may be included in a device can be identified by a person having ordinary skill in the art. In a device including semiconductor nanocrystals capable of emitting blue light, for example, a hole transport layer comprising 4-4'-N,N'-dicarbazolyl-biphenyl (CBP) and an electron transport layer comprising 2,2',2"-(1,3,5-Benzinetriyl)-tris(1-phenyl-1-H-benzimidazole) (TBPi) can be used. U.S. Provisional Patent Application No. 60/825,374, filed 12 Sep. 2006, of Seth A. Coe-Sullivan et al., for "Light-Emitting Devices And Displays With Improved Performance". Additional information concerning devices, device structures, examples of materials for use in various device structures, etc. is discussed in U.S. Provisional Patent Application No. 60/825,374, filed 12 Sep. 2006, of Seth A. Coe-Sullivan et al., for "Light-Emitting Devices And Displays With Improved Performance", which is hereby incorporated herein by reference, and elsewhere herein.

For additional information concerning devices, light sources, and compositions see also, for example, U.S. Pat. No. 5,434,878 of Lawandy; U.S. Pat. No. 5,882,779 of Lawandy; U.S. Pat. No. 6,890,777 of Bawendi et al.; U.S. Pat. No. 6,803,719 of Miller et al. Each of the foregoing patents is hereby incorporated herein by reference in its entirety.

In accordance with various aspects and embodiments of devices of the present invention, a device comprises a light-emitting device.

In accordance with various aspects and embodiments of devices of the present invention, a device comprises a display device.

In accordance with various aspects and embodiments of devices of the present invention, a device comprises a solid state lighting device.

In certain embodiments of the inventions described or contemplated by this general description, the following detailed description, and claims, a semiconductor nanocrystal can include one or more ligands attached to the outer surface thereof.

In certain embodiments of the inventions described or contemplated by this general description, the following detailed description, and claims, including a second semiconductor material, the second semiconductor material preferably has a composition that is different from the composition of the core. Although, in certain embodiments, a shell may comprise a second semiconductor material with the same composition as that of the first semiconductor material. In certain embodiments, the second semiconductor material can comprise a mixture or alloy of the two or more semiconductor materials. In certain embodiments, two or more shells can be disposed over at least a portion of the core wherein each shell can include single semiconductor material and/or a mixture of one or more semiconductor materials. Each shell may include one or more monolayers. In certain embodiments of the inventions described or contemplated by this general description, the following detailed description, and claims, the photoluminescence quantum efficiency can be determined when the semiconductor nanocrystals are dispersed in anhydrous hexane and excited by 373 nm light at room temperature. The concentration of semiconductor nanocrystals in the dispersion can be in a range between about 0.1 to about 1 weight percent, e.g., about 10 mg/ml, etc.

The foregoing, and other aspects described herein all constitute embodiments of the present invention.

It is to be understood that both the foregoing general description and the following detailed description are exemplary and explanatory only and are not restrictive of the invention as claimed. Other embodiments will be apparent to those skilled in the art from consideration of the description, from the claims, and from practice of the invention disclosed herein.

DETAILED DESCRIPTION OF THE INVENTION

A semiconductor nanocrystal is capable of emitting light upon excitation. A semiconductor nanocrystal can be excited by irradiation with an excitation wavelength of light, by electrical excitation, or by other energy transfer.

A semiconductor nanocrystal is a nanometer sized particle, e.g., in the size range of up to about 1000 nm. In certain embodiments, a semiconductor nanocrystal can have a size in the range of up to about 100 nm. In certain embodiments, a semiconductor nanocrystal can have a size in the range up to about 20 nm (such as about 1, 2, 3, 4, 5, 6, 7, 8, 9, 10, 11, 12, 13, 14, 15, 16, 17, 18, 19, or 20 nm). In certain preferred embodiments, a semiconductor nanocrystal can have a size less than 100 Å. In certain preferred embodiments, a semiconductor nanocrystal has a size in a range from about 1 to about 6 nanometers and more particularly from about 1 to about 5 nanometers. The size of a semiconductor nanocrystal can be determined, for example, by direct transmission electron microscope measurement. Other known techniques can also be used to determine nanocrystal size.

A semiconductor nanocrystals can have various shapes. Examples of the shape of a nanocrystal include, but are not limited to, sphere, rod, disk, tetrapod, other shapes, and/or mixtures thereof.

In certain preferred embodiments, a semiconductor nanocrystal includes a core/shell structure.

Examples of preferred inorganic semiconductor materials that can be included in a semiconductor nanocrystal, a core and/or a shell include inorganic semiconductor materials that can be represented by the general formula MA. (This general formula does not represent the actual relative molar amounts of the various chemical elements comprising the inorganic semiconductor material.) In certain examples M comprises, for example, one or more elements from Group IA element (for example, lithium, sodium, rubidium, and cesium), Group IIA (for example, beryllium, magnesium, calcium, strontium, and barium), Group IIB (for example, Zn, Cd, and Hg), Group IIIA (for example, B, Al, Ga, In, and Tl), Group IVA (for example, Si, Ge, Sn, and Pb), and/or the transition metals (for example, Ti, Zr, Hf, V, Nb, Ta, Cr, Mo, W, Mn, Tc, Re, Fe, Co, Ni, Pd, Pt, Rh, and the like). (See, F. A. Cotton et al., Advanced Inorganic Chemistry, 6th Edition, (1999). In certain examples, A comprises one or more elements from Group VA (for example, nitrogen, phosphorus, arsenic, antimony, and bismuth) and/or Group VIA (for example, oxygen, sulfur, selenium, and tellurium). Examples of materials represented by the formula MA include Group II-VI compounds, Group II-V compounds, Group III-VI compounds, Group III-V compounds, Group IV-VI compounds, Group I-III-VI compounds, Group II-IV-VI compounds, Group II-IV-V compounds, and/or mixtures or alloys thereof, including ternary and quaternary mixtures or alloys. Other inorganic semiconductor materials will be readily ascertainable by one of ordinary skill in the art.

Alternatively, a semiconductor nanocrystal, a semiconductor nanocrystal core and/or a shell can comprise, for example, a Group IV element. In certain embodiments, a semiconductor nanocrystal is crystalline.

As discussed herein, in certain embodiments, three or more chemical elements included in a semiconductor nanocrystal, a semiconductor nanocrystal core and/or a shell can comprise an alloy. The alloy can be homogeneous or non-homogeneous. In certain embodiments including a first semiconductor and/or second semiconductor material, one or both of the first and second semiconductor materials can comprise an alloy, either or both of which can be homogeneous or non-homogeneous. A homogeneous alloyed semiconductor nanocrystal, core, and/or shell can be identified by techniques that are known to the person of ordinary skill in the art. See, for example, U.S. Pat. No. 7,056,0471 of Han et al., for "Ternary And Quaternary Nanocrystals, Processes For Their Production And Uses Thereof, issued 6 Jun. 2006.

Non-limiting examples of semiconductor materials that comprise three or more chemical elements include those represented by the general formula MA wherein M comprises at least two different chemical elements and A comprises at least one chemical element or wherein M comprises at least one chemical element and A comprises at least two different chemical elements.

In certain embodiments of semiconductor nanocrystals including a core/shell structure, a core/shell nanocrystal can have an average diameter from, for example, about 3 to about 55 nm, from about 3 to about 40 nm, from about 3 to about 25 nm, from about 3 to about 10 nm, etc. In certain embodiments, the average diameter of a nanocrystal core can be, for example, from about 1 to about 7 nm, from about 1 to about 4 nm, from about 2 to about 3 nm, from about 4 to about 7 nm, etc. An example of an average thickness for a shell is from about 1 to about 3 nm, which corresponds to an approximately 10 monolayer thickness. (In such example, a monolayer thickness would be approximately from about 1 to about 3 Angstroms.) The actual monolayer thickness is dependent upon the size and composition of the molecules included in the shell.

In certain embodiments of the invention, the core can comprise an alloy of the chemical elements.

In certain embodiments, the core can comprise a homogeneous alloy of the chemical elements.

In certain embodiments of the invention, the shell can comprise an alloy of the chemical elements.

In certain embodiments, the shell can comprise a homogeneous alloy of the chemical elements.

In certain embodiments, a semiconductor nanocrystal can include one or more ligands attached to the outer surface thereof.

Selection of the composition of a semiconductor nanocrystal, as well as the size of the semiconductor nanocrystal, can affect the characteristic spectral emission wavelength of the semiconductor nanocrystal. Thus, as one of ordinary skill in the art will realize, a particular composition of a core will be selected based upon the spectral region desired. A nanocrystal core that emits energy in the visible range of the spectrum can comprise, by way of non-limiting example, CdS, CdSe, CdTe, ZnSe, ZnTe, GaP, GaAs, etc. Semiconductor nanocrystal cores that emit energy in the near IR range include, but are not limited to, InP, InAs, InSb, PbS, PbSe, etc. Semiconductor nanocrystal cores that emit energy in the blue to near-ultraviolet include, but are not limited to ZnS, GaN, etc. For any particular composition selected for inclusion in a semiconductor nanocrystal core contemplated, it is possible to tune the emission to a desired wavelength by controlling the thickness of the shell, based on the band gap of the shell material.

For applications that utilize the luminescent properties of a nanocrystal, the semiconductor nanocrystal size is selected such that the nanocrystal exhibits quantum confinement. Such applications include, but are not limited to, light-emitting devices, lasers, biomedical tags, photoelectric devices, solar cells, catalysts, and the like. Light-emitting devices including nanocrystals in accordance with the present invention may be incorporated into a wide variety of consumer products, including, but not limited to, flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control such devices, including passive matrix and active matrix.

An example of a method of manufacturing a semiconductor nanocrystal or a core for a semiconductor nanocrystal including a core/shell structure comprises a colloidal growth process. Colloidal growth occurs by injection of the precursors for the semiconductor nanocrystal or core, as the case may be, in the case of a first semiconductor material, e.g., an M donor and an A donor, into a hot coordinating or non-coordinating solvent. One example of a method for preparing monodisperse semiconductor nanocrystals comprises pyrolysis of organometallic reagents, such as dimethyl cadmium, injected into a hot, coordinating solvent. This permits discrete nucleation and results in the controlled growth of macroscopic quantities of semiconductor nanocrystal cores. The injection produces a nucleus that can be grown in a controlled manner to form a semiconductor nanocrystal or core. The reaction mixture can be gently heated to grow and anneal the semiconductor nanocrystal or core. Both the average size and the size distribution of the semiconductor nanocrystals or cores in a sample are dependent on the growth temperature. The growth temperature necessary to maintain steady growth increases with increasing average crystal size. The semiconductor nanocrystal or core is a member of a population of semiconductor nanocrystals. As a result of the discrete nucleation and controlled growth, the population of semiconductor nanocrystals or cores that can be obtained has a narrow, monodisperse distribution of diameters. The monodisperse distribution of diameters can also be referred to as a size. Preferably, a monodisperse population of nanocrystals includes a population of particles wherein at least about 60% of the particles in the population fall within a specified particle size range. A population of monodisperse particles preferably deviate less than 15% rms (root-mean-square) in diameter, more preferably less than 10% rms and most preferably less than 5%.

In certain embodiments, the preparation of semiconductor nanocrystal or cores can be carried out in the presence of an amine. See, for example, U.S. Pat. No. 6,576,291 for "Preparation of Nanocrystallites" of Bawendi et al. issued 10 Jun. 2003, which is hereby incorporated herein by reference in its entirety.

The narrow size distribution of the semiconductor nanocrystals (e.g., semiconductor nanocrystals including or not including a core/shell structure, cores, etc.) allows the possibility of light emission in narrow spectral widths. Monodisperse semiconductor nanocrystals have been described in detail in Murray et al. (J. Am. Chem. Soc., 115:8706 (1993)); in thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 for "Highly Luminescent Color-Selective Materials". The foregoing are hereby incorporated herein by reference in their entireties.

The process of controlled growth and annealing of the semiconductor nanocrystals or cores in the coordinating solvent that follows nucleation can also result in uniform surface derivatization and regular structures. As the size distribution sharpens, the temperature can be raised to maintain steady growth. By adding more M donor or A donor, the growth period can be shortened. In certain embodiments, an M donor can comprise, for example, an inorganic compound, an organometallic compound, or elemental metal. In certain embodiments, for example, M can comprise cadmium, zinc, magnesium, mercury, aluminum, gallium, indium, thallium, etc. In certain embodiments, an A donor can comprise a compound capable of reacting with the M donor to form a material with the general formula MA. For example, the A donor can comprise a chalcogenide donor or a pnictide donor, such as elemental form dispersed in a solvent (e.g., Se in octadecene, S in an amine, etc.), a phosphine chalcogenide, a bis(silyl) chalcogenide, dioxygen, an ammonium salt, or a tris(silyl) pnictide. Additional examples of suitable A donors include, but are not limited to, dioxygen, bis(trimethylsilyl) selenide ((TMS)$_2$Se), trialkyl phosphine selenides such as (tri-noctylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl) telluride ((TMS)$_2$Te), bis(trimethylsilyl)sulfide ((TMS)$_2$S), a trialkyl phosphine sulfide such as (tri-noctylphosphine) sulfide (TOPS), an ammonium salt such as an ammonium halide (e.g., NH$_4$Cl), tris(trimethylsilyl) phosphide ((TMS)$_3$P), tris(trimethylsilyl) arsenide ((TMS)$_3$As), or tris(trimethylsilyl) antimonide ((TMS)$_3$Sb). In certain embodiments, the M donor and the A donor can be moieties within the same molecule.

Suitable solvents for use in preparing semiconductor nanocrystals, semiconductor nanocrystal cores, and/or shells include coordinating solvents and non-coordinating solvents. A coordinating solvent can help control the growth of the semiconductor nanocrystal core. A coordinating solvent is a compound having at least one donor site (e.g., lone electron pair) that, for example, is available to coordinate to a surface of the growing semiconductor nanocrystal. Solvent coordination can stabilize the growing semiconductor nanocrystal. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the semiconductor nanocrystal production. In certain embodiments, a coordinating solvent comprises pyridine, tri-n-octyl phosphine (TOP), tri-n-octyl phosphine oxide (TOPO) and trishydroxylpropylphosphine (tHPP), amines (including, but not limited to, for example, decylamine, hexadecylamine, octadecylamine). Other examples include octadecene and squalene. Technical grade TOPO can also be used.

Alternatively, a non-coordinating solvent can be used. Examples of suitable non-coordinating solvents include, but are not limited to, squalane, octadecane, and saturated hydrocarbon solvents.

Other methods and method variations (e.g., including different solvents, precursors, reaction conditions, etc.) can also be used in preparing semiconductor nanocrystals. Such methods and variations are within the skill of one of ordinary skill in the art.

Size distribution during the growth stage of the reaction can be estimated by monitoring the absorption and/or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals as well as to sharpen size distribution. For example, for ZnS, CdSe, CdTe, PbSe, and InSb, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm. By stopping growth at a particular semiconductor nanocrystal average diameter, a population having an average semiconductor nanocrystal diameter of less than 150 Å can be obtained. A population of nanocrystals can have an average diameter of 15 Å to 125 Å.

The particle size distribution of the semiconductor nanocrystals can be further refined by size selective precipitation with a poor solvent for the semiconductor nanocrystals, such as methanol/butanol as described in U.S. Pat. No. 6,322,901. For example, semiconductor nanocrystals can be dispersed in a solution of 10% butanol in hexane. Methanol can be added dropwise to this stifling solution until opalescence persists. Separation of supernatant and flocculate by centrifugation produces a precipitate enriched with the largest nanocrystals in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected semiconductor nanocrystal population preferably has no more than a 15% rms deviation from mean diameter, more preferably 10% rms deviation or less, and most preferably 5% rms deviation or less.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

An example of a process for forming a shell over at least a portion of a core is described, for example, in U.S. Pat. No. 6,322,901, incorporated herein by reference in its entirety. By adjusting the temperature of the reaction mixture during overcoating and monitoring the absorption spectrum of the core, over coated materials having high emission quantum efficiencies and narrow size distributions can be obtained. Alternatively, a shell can be formed by exposing a core nanocrystal having a first composition and first average diameter to a population of nanocrystals having a second composition and a second average diameter smaller than the first average diameter.

Examples of semiconductor materials that can be included in a shell are discussed elsewhere herein.

In certain preferred embodiments, the shell comprises $Cd_xZn_{1-x}S$, wherein $0<x<1$. In preferred embodiments, a shell comprising $Cd_xZn_{1-x}S$, wherein $0<x<1$, is obtainable by a process comprising adding Cd-precursor, Zn-precursor, and S-precursor to a nanocrystal core and subsequently adding additional Zn-precursor and S-precursor thereto.

In certain embodiments, the Cd-precursor, Zn-precursor, and S-precursor are admixed with nanocrystal cores at a temperature sufficient to induce formation of shell material on at least a portion of the surfaces of at least a portion of the cores. The subsequently added additional amounts of Zn-precursor and S-precursor are admixed with the nanocrystal cores to which the Cd-precursor, Zn-precursor, and S-precursor has been previously added. Preferably the temperature of the admixture to which additional Zn-precursor and S-precursor are added is at a temperature sufficient to induce formation of additional shell material on at least a portion of the surfaces of at least a portion of the cores including shell material. Overcoating is preferably carried out in a liquid medium. In certain embodiments, the liquid medium comprises a coordinating solvent. Suitable coordinating solvents include any coordinating solvent that can be used in preparation of nanocrystal cores. In certain embodiments, the semiconductor nanocrystal cores are dispersed in the coordinating solvent. In certain other embodiments, the nanocrystal cores are colloidally dispersed in the coordinating solvent during at least part of the overcoating process. In certain other embodiments, the liquid medium can comprise a non-coordinating solvent.

In embodiments wherein a semiconductor nanocrystal comprises a core/shell structure, shell thickness can be varied by growing a desired thickness of the shell. For example, the shell can have a thickness less than about one monolayer, about one monolayer, or more than about one monolayer. The thickness is selected to achieve the predetermined characteristics of the core/shell nanocrystal. For example, in certain embodiments, the shell thickness can be at least about one monolayer. Preferably, the thickness is less than that at which quantum confinement is not achieved. In certain embodiments, the thickness is in a range from greater than 0 to about 20 monolayers. In certain embodiments, the thickness is in a range from greater than 0 to about 10 monolayers. In certain embodiments, the thickness is in a range from greater than 0 to about 5 monolayers. In certain embodiments, the thickness is in a range from about 1 to about 5 monolayers. In certain embodiments, the thickness is in a range from about 3 to about 5 monolayers. In certain embodiments, more than 20 monolayers can be grown.

As discussed above, in certain embodiments, more than one shell can be included over a core.

By selecting and adjusting the temperature of the reaction mixture during overcoating and monitoring the absorption spectrum of the core, overcoated materials having high emission quantum efficiencies and narrow size distributions can be obtained. The selection and adjustment is within the skill of one of ordinary skill in the art.

In certain embodiments, the band gap of the shell material is greater than that of the core. In certain other embodiments, the band gap of the shell material is less than that of the core.

In certain embodiments, the shell is disposed on, for example, at least 60%, at least 70%, at least 80%, at least 90% of the nanocrystal core. In certain preferred embodiment, the nanocrystal core is substantially completely (e.g., greater than 95%, greater than 96%, greater than 97%, greater than 98%, greater than 99%) overcoated with the shell.

Precursors for a shell or second semiconductor material included in the shell can be in any form that is suitable for the generation of the shell. Such forms are known to or can be determined by the skilled person. Examples of the numerous suitable precursors for M' comprising cadmium and zinc include organometallic compounds, for example, alkylated compounds such as dimethylzinc ($ZnMe_2$), diethylzinc ($ZnEt_2$), dimethylcadmium ($CdMe_2$), or as salts or long chain alkyl carboxylic acid derivatives such as cadmium stearate. Examples of suitable precursors for A' comprising sulfur include bis(trimethylsilyl)sulfide (($TMS)_2S$) (also referred to as hexamethyldisilathiane), elemental sulfur, etc. Precursors can be synthesized and used as stock solutions or made in situ. Examples of suitable precursor molecules of Cd, Zn, and S and the preparation thereof, are described in Murray et al., supra; Cao and Banin, J. Am. Chem. Soc. 122, pages 9692 9702, (2000); Peng et al, supra, Dabboussi et al, J. Phys. Chem. B, 101, pages 9643 9475, (1997), or U.S. Pat. No. 6,322,901 for instance, the contents of all of which are hereby incorporated by reference.

In certain embodiments of forming a shell over a core, semiconductor nanocrystal cores, a liquid medium, and any optional additives are heated to a temperature between 100-360° C. prior to the addition of any shell precursors. Preferably the mixture is heated to a temperature of 170° C. In one embodiment the mixture is kept at a temperature of approximately 170° C. for between 5 minutes and 2 hours after addition of the precursors, preferably the mixture is kept at a temperature of 170° C. for 10 minutes after addition of the precursors.

In certain embodiments, the precursors are preferably added in predetermined amounts at a predetermined rate of addition.

Such additions can be carried out with use of a programmable metering device. For small scale preparations, a programmable syringe pump can be used.

In certain embodiments, the precursors can be added as a continuous flow. In certain embodiments, for example, one or more of the precursors can be added in a continuous liquid flow. In certain other embodiments, for example, all of the precursors can be added in a continuous liquid flow.

Alternatively, a continuous flow can be achieved in a gas flow.

In certain embodiments, the precursors can be added as a continuous flow at a predetermined rate.

A wealth of suitable high boiling point liquids exist that can be used as coordinating solvents in the preparation of a shell. Among the different types of high boiling point liquids that can be used are alkyl phosphine/phosphine oxide/phosphite/phosphate/amine/phosphonic acid/ether/alkane, etc.

Specific examples of suitable liquids and liquid mixtures that are suitable for use as coordinating solvents include but are not limited to trioctylphosphine, tributylphosphine, tri(dodecyl)phosphine, trioctylphosphine oxide, dibutyl-phosphite, tributyl phosphite, trioctadecyl phosphite, trilauryl phosphite, tris(tridecyl) phosphite, triisodecyl phosphite, bis(2-ethylhexyl)phosphate, tris(tridecyl) phosphate, hexadecylamine, oleylamine, octadecylamine, bis(2-ethylhexyl) amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, and hexyl octanoate. Other examples include octadecene and squalene.

Examples of suitable non-coordinating solvents include, but are not limited to, squalane, octadecane, and saturated hydrocarbon solvents.

Optionally, an amine can be further admixed with the nanocrystal cores and liquid medium prior to addition of the shell pre-cursors.

Examples of amines include, but are not limited to, primary alkyl amine or a primary alkenyl amine, such as a $C_2$-$C_{20}$ alkyl amine, a $C_2$-$C_{20}$ alkenyl amine, preferably a $C_8$-$C_{18}$ alkyl amine or a $C_8$-$C_{18}$ alkenyl amine. A preferred amine is decylamine.

The presence of amine in the liquid medium, whether in preparing semiconductor nanocrystal, a semiconductor nanocrystal core and/or a shell, can contribute to the quality of the semiconductor nanocrystal obtained from an M or M' donor (e.g., an M or M'-containing salt) and A or A' donor. In certain embodiments, the solvent comprises alkyl phosphine oxide and includes an amine, wherein the amine and an alkyl phosphine oxide are present in a mole ratio of, for example 10:90, 30:70, or 50:50. A combined amine and solvent mixture can decrease size dispersion and can improve photoluminescence quantum yield of the semiconductor nanocrystal. For example, suitable amines for combining with trioctylphosphine oxide (TOPO) include 1-hexadecylamine, or oleylamine. When the 1,2-diol or aldehyde and the amine are used in combination with the M-containing salt to form a population of semiconductor nanocrystals, the photoluminescence quantum efficiency and the distribution of semiconductor nanocrystal sizes can be improved in comparison to semiconductor nanocrystals manufactured without the 1,2-diol or aldehyde or the amine.

It is understood that the invention contemplates a semiconductor nanocrystal including all sizes and shapes of semiconductor nanocrystals, semiconductor nanocrystal cores, and/or core/shell structures.

In certain preferred embodiments, a semiconductor nanocrystal in accordance with the present invention can include at least one ligand attached thereto.

Preferably, a ligand comprises an organic material. A ligand may be any number of materials, but has an affinity for the semiconductor nanocrystal surface. For example, a ligand can be an isolated organic molecule, a polymer (or a monomer for a polymerization reaction), an inorganic complex, and an extended crystalline structure. A ligand can be used to enhance the functionality, binding properties, dispersibility of a coated semiconductor nanocrystal homogeneously into a chosen medium, or the like. In addition, a ligand can be used to tailor the optical properties of the semiconductor nanocrystal.

In certain embodiments, the ligands can be derived from the solvent used during the growth process. The surface can be modified by repeated exposure to an excess of a competing coordinating group to form an overlayer. For example, a dispersion of the capped semiconductor nanocrystal can be treated with a coordinating organic compound, such as pyridine, to produce nanocrystals which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a liquid medium in which the semiconductor nanocrystal is suspended or dispersed. Such affinity improves the stability of the suspension and discourages flocculation of the semiconductor nanocrystal.

The organic ligands can be useful in facilitating large area, non-epitaxial deposition of highly stable inorganic nanocrystals within a device.

More specifically, the coordinating ligand can have the formula:

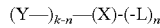

wherein k is 2, 3 4, or 5, and n is 1, 2, 3, 4 or 5 such that k-n is not less than zero; X is O, O—S, O—Se, O—N, O—P, O—As, S, S=O, SO2, Se, Se=O, N, N=O, P, P=O, C=O As, or As=O; each of Y and L, independently, is H, OH, aryl, heteroaryl, or a straight or branched C2-18 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)—, —N(Ra)—C(O)—O—, —O—C(O)—N(Ra)—, —N(Ra)—C(O)—N(Rb)—, —O—C(O)—O—, —P(Ra)—, or —P(O)(Ra)—. Each of Ra and Rb, independently, is hydrogen, alkyl, alkenyl, alkynyl, alkoxy, hydroxylalkyl, hydroxyl, or haloalkyl. An aryl group is a substituted or unsubstituted aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

Monodentate alkyl phosphines (and phosphine oxides, the term phosphine in the following discussion of ligands will refer to both) can passivate nanocrystals efficiently. When nanocrystals with conventional monodentate ligands are diluted or embedded in a non-passivating environment (i.e. one where no excess ligands are present), they can lose their high luminescence and their initial chemical inertness. Typical are an abrupt decay of luminescence, aggregation, and/or phase separation. In order to overcome these possible limitations, polydentate ligands can be used, such as a family of polydentate oligomerized phosphine ligands. The polydentate ligands show a high affinity between ligand and nanocrystal surface. In other words, they are stronger ligands, as is expected from the chelate effect of their polydentate characteristics.

Oligomeric phosphines have more than one binding site to the nanocrystal surface, which ensures their high affinity to the nanocrystal surface. See, for example, for example, U.S. Ser. No. 10/641,292, filed Aug. 15, 2003 (now U.S. Pat. No. 7,160,613), and U.S. Ser. No. 60/403,367, filed Aug. 15, 2002, each of which is incorporated by reference in its entirety. The oligomeric phosphine can be formed from a monomeric, polyfunctional phosphine, such as, for example, trishydroxypropylphosphine, and a polyfunctional oligomerization reagent, such as, for example, a diisocyanate. The oligomeric phosphine can be contacted with an isocyanate of formula R'-L-NCO, wherein L is $C_2$-$C_{24}$ alkylene, and R' has the formula

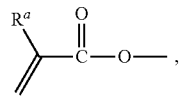

R' has the formula

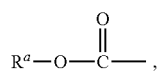

wherein $R^a$ is hydrogen or $C_1$-$C_4$ alkyl, or R' is hydrogen.

A suitable coordinating ligand can be purchased commercially or prepared by ordinary synthetic organic techniques, for example, as described in J. March, Advanced Organic Chemistry, which is hereby incorporated by reference in its entirety.

Other ligands are described in U.S. patent application Ser. No. 10/641,292 for "Stabilized Semiconductor Nanocrystals", filed 15 Aug. 2003, which is hereby incorporated herein by reference in its entirety.

EXAMPLES

The examples provided herein are provided as examples and not limitations, wherein a number of modifications of the exemplified compositions and processes are contemplated and within the scope of the present invention.

Unless otherwise specified, the following core preparations and manipulations and shell preparations and manipulations were carried out in a nitrogen atmosphere.

Example 1

Core Preparation 0.026 g CdO (99.998% purity—Alfa) and 0.043 g of ZnO (99.999% purity—Sigma Aldrich) were weighed into a three necked flask equipped with a condenser. To this was added: 2 ml tech grade oleic acid (Aldrich) and 16 ml of tech grade octadecene (ODE) (Aldrich). The contents of the flask were degassed at 80° C. for 20 minutes in vacuo (200 millitorr).

Separately 0.038 g of sulfur (99.999% Strem) was dissolved in 10 ml of tech grade ODE in a septum capped vial by stirring and heating in an oil bath to 130° C. While the sample was heating up, the pressure of the vessel was reduced to 200 millitorr until the oil bath temperature was 85° C., then further heating was continued under nitrogen. After 1 hour, when all the sulfur was dissolved, the sample was cooled to room temperature.

The contents of the three necked flask were stirred and heated to 310° C. under nitrogen until all the oxides dissolved to give a clear solution. The temperature controller was then set to 300° C. and once the temperature stabilized at 300° C., approximately 4.4 ml of S in ODE was rapidly injected. The temperature of the solution fell to about 270° C. and climbed back to 300° C. in ~30 minutes. The reaction was stopped after 3 hours and the contents of the flask were transferred to a degassed vial under nitrogen and transferred to an inert atmosphere box for further purification.

The cores were purified by precipitation as follows. (In this example, the precipitation step was carried out two times for each sample.) The solution was divided in half; each half was added to a separate centrifuge tube. Excess butanol (~20-30 ml) was added to each centrifuge tube. Each tube was then centrifuged for 5 min, 4000 rpm. After centrifuging, the supernatant liquid was poured off, retaining the solid in each centrifuge tube. ~5 ml of hexane was added to the solid in each centrifuge tube and the contents of each centrifuge tube were mixed using a vortexer. After mixing, each centrifuge tube was centrifuged again. The supernatant liquid from each centrifuge tube was transferred to a separate clean tube; the solids in each centrifuge tube were discarded. Cores were precipitated from the supernatant liquid in each of the separate tubes by adding excess butanol (20-25 ml) with stirring. The new tubes containing the precipitated cores were centrifuged, the supernatant liquid decanted, leaving precipitated cores in each tube. ~5-6 ml anhydrous hexane were added to the precipitated cores in each tube to solvate the cores and the contents of each tube was filtered through a 0.2 micron filter. (The cores are in the filtrate.)

A 2.5 μl aliquot of the filtrate was diluted 100 fold with anhydrous hexane and a UV VIS spectrum of the diluted aliquot was measured and absorbance at 350 nm measured.
Characterization of the Cores:
  first peak 437 nm, abs=0.057, at 350 nm, abs=0.344
  maximum peak emission—445 nm
  FWHM=15 nm
  Photoluminescence quantum efficiency ~31%

Example 1B

Shell Preparation (ZnS)

5 ml of 97% trioctylphosphine and 5 ml of oleylamine (distilled prior to use), were placed in a 4 necked flask equipped with a condenser and thermocouple. The sample was stirred and degassed at 100° C. for ~1 hour. After introducing $N_2$ to the flask and reducing the temperature to 80° C., 4.2 ml of hexane containing core (see Example 1A above) was added and the solvent removed under vacuo for 2 hours. The temperature was raised to 170° C. and bis-trimethylsilylsulfide (137 mg) in 4 ml of TOP and diethylzinc (47.4 mg) in 4 ml of TOP were added from separate syringes at a rate of 50 microliters/minute. The solution in the flask was observed to develop a bluish color. After addition was complete, the solution looked cloudy. The sample was transferred via a degassed vial into an inert atmosphere box.

The cores including a ZnS shell were purified by precipitation as follows. (In this example, the precipitation step was carried out two times for each sample.) were purified as follows. The solution was divided into 2 centrifuge tubes. Excess butanol (~20-30 ml) was added to each centrifuge tube. The centrifuge tubes were centrifuged for 5 minutes at 4000 rpm. After centrifuging, the supernatant liquid was poured off, retaining the solid in each centrifuge tube. ~5 ml of hexane was added to the solid in each centrifuge tube and the contents of each centrifuge tube were mixed using a vortexer. Semiconductor nanocrystals comprising a core and a ZnS shell disposed over the core were precipitated by adding excess butanol (20-25 ml) with stirring. The centrifuge tube contents were centrifuged. The supernatant liquid was decanted, leaving the semiconductor nanocrystals in the centrifuge tubes. ~5 ml anhydrous hexane were added to the semiconductor nanocrystals in one of the centrifuge tubes to solvate the semiconductor nanocrystals. The hexane including the solvated semiconductor nanocrystals was then transferred into the second centrifuge tube to solvate the semiconductor nanocrystals contained therein. The mixture including the hexane and the semiconductor nanocrystals from both centrifuge tubes was filtered through a 0.2 micron filter. (The overcoated cores are in the filtrate.)
Characterization of the Core/Shell Nanocrystals:
  maximum peak emission—446 nm
  FWHM 17 nm
  Photoluminescence quantum efficiency ~100%

Example 2A

Core Preparation 0.025 g CdO (99.998% Alfa) and 0.035 g of ZnO (99.999% Sigma Aldrich) were weighed into a three necked flask equipped with a condenser. To this was added: 2 ml tech grade oleic acid (Aldrich) and 16 ml of tech grade octadecene (ODE) (Aldrich). The contents of the flask were degassed at 80° C. for 20 minutes in vacuo (200 millitorr).

Separately 0.035 g of sulfur (99.999% Strem) was dissolved in 10 ml of tech grade ODE in a septum capped vial by stirring and heating in an oil bath to 130° C. While the sample was heating up, the pressure of the vessel was reduced to 200 millitorr until the oil bath temperature was 85° C., then further heating was continued under nitrogen. After 1 hour, when all the sulfur was dissolved, the sample was cooled to room temperature.

The contents of the three necked flask were stirred and heated to 310° C. under nitrogen until all the oxides dissolved to give a clear solution. The temperature controller was then set to 300° C. and once the temperature stabilized at 300° C., approximately 4.0 ml of S in ODE was rapidly injected. The temperature of the solution fell to about 270° C. and climbed back to 300° C. in ~30 minutes. The reaction was stopped after 4 hours and the contents of the flask were transferred to a degassed vial under nitrogen and transferred to an inert atmosphere box for further purification.

The cores were purified by precipitation as follows. (In this example, the precipitation step was carried out two times for each sample.) The solution was divided in half; each half was added to a separate centrifuge tube. Excess butanol (~20-30 ml) was added to each centrifuge tube. Each tube was then centrifuged for 5 min, 4000 rpm. After centrifuging, the supernatant liquid was poured off, retaining the solid in each centrifuge tube. ~5 ml of hexane was added to the solid in each centrifuge tube and the contents of each centrifuge tube were mixed using a vortexer. After mixing, each centrifuge tube was centrifuged again. The supernatant liquid from each centrifuge tube was transferred to a separate clean tube; the solids in each centrifuge tube were discarded. Cores were precipitated from the supernatant liquid in each of the separate tubes by adding excess butanol (20-25 ml) with stirring. The new tubes containing the precipitated cores were centrifuged, the supernatant liquid decanted, leaving precipitated cores in each tube. ~5-6 ml anhydrous hexane were added to the precipitated cores in each tube to solvate the cores and the contents of each tube was filtered through a 0.2 micron filter. (The cores are in the filtrate.)

A 2.5 µl aliquot of the filtrate was diluted 100 fold with anhydrous hexane and a UV VIS spectrum of the diluted aliquot was measured and absorbance at 350 nm measured.
Characterization of the Cores:
first peak 457 nm, abs=0.081, at 350 nm, abs=0.469
maximum peak emission—461 nm
FWHM 15 nm
Photoluminescence quantum efficiency ~22%

Example 2B

Shell Preparation (ZnS)

5 ml of 97% trioctylphosphine and 5 ml of oleylamine (distilled prior to use), were placed in a 4 necked flask equipped with a condenser and thermocouple. The sample was stirred and degassed at 100° C. for ~1 hour. After introducing $N_2$ to the flask and reducing the temperature to 80° C., 3.5 ml of hexane containing cores (see Example 1A above) was added and the solvent removed under vacuo for 2 hours. The temperature was raised to 170° C. and bis-trimethylsilylsulfide (79.6 mg) in 4 ml of TOP and diethyl-zinc (27.6 mg) in 4 ml of TOP were added from separate syringes at a rate of 50 microliters/minute. The solution in the flask was observed to develop a bluish color. After addition was complete, the solution looked cloudy. The sample was transferred via a degassed vial into an inert atmosphere box.

The cores including a ZnS shell were purified by precipitation as follows. (In this example, the precipitation step was carried out two times for each sample.) The solution was divided into 2 centrifuge tubes. Excess butanol (~20-30 ml) was added to each centrifuge tube. The centrifuge tubes were centrifuged for 5 minutes at 4000 rpm. After centrifuging, the supernatant liquid was poured off, retaining the solid in each centrifuge tube. ~5 ml of hexane was added to the solid in each centrifuge tube and the contents of each centrifuge tube were mixed using a vortexer. Semiconductor nanocrystals comprising a core and a ZnS shell disposed over the core were precipitated by adding excess butanol (20-25 ml) with stirring. The centrifuge tube contents were centrifuged. The supernatant liquid was decanted, leaving the semiconductor nanocrystals in the centrifuge tubes. ~5 ml anhydrous hexane were added to the semiconductor nanocrystals in one of the centrifuge tubes to solvate the semiconductor nanocrystals. The hexane including the solvated semiconductor nanocrystals was then transferred into the second centrifuge tube to solvate the semiconductor nanocrystals contained therein. The mixture including the hexane and the semiconductor nanocrystals from both centrifuge tubes was filtered through a 0.2 micron filter. (The overcoated cores are in the filtrate.)
Characterization of the Core/Shell Nanocrystals:
maximum peak emission—464 nm
FWHM 17 nm
Photoluminescence quantum efficiency ~74%

Example 3A

Core Preparation 0.025 g CdO (99.998% purity Aldrich) and 0.033 g of ZnO (99.998% Sigma Aldrich) were weighed into a three necked flask equipped with a condenser. To this was added: 2 ml tech grade oleic acid (Aldrich) and 16 ml of tech grade octadecene (ODE) (Aldrich). The contents of the flask were degassed at 80° C. for 20 minutes in vacuo (200 millitorr).

Separately 0.032 g of sulfur (99.999% Strem) was dissolved in 10 ml of tech grade ODE in a septum capped vial by stirring and heating in an oil bath to 130° C. While the sample was heating up, the pressure of the vessel was reduced to 200 millitorr until the oil bath temperature was 85° C., then further heating was continued under nitrogen. After 1 hour, when all the sulfur was dissolved, the sample was cooled to room temperature.

The contents of the three necked flask were stirred and heated to 310° C. under nitrogen until all the oxides dissolved to give a clear solution. The temperature controller was then set to 300° C. and once the temperature stabilized at 300° C., approximately 4.0 ml of S in ODE was rapidly injected. The temperature of the solution fell to about 270° C. and climbed back to 300° C. in ~30 minutes. The reaction was stopped after 4 hours and the contents of the flask were transferred to a degassed vial under nitrogen and transferred to an inert atmosphere box for further purification.

The cores were purified by precipitation as follows. (In this example, the precipitation step was carried out two times for each sample.) The solution was divided in half; each half was added to a separate centrifuge tube. Excess butanol (~20-30 ml) was added to each centrifuge tube. Each tube was then centrifuged for 5 min, 4000 rpm. After centrifuging, the supernatant liquid was poured off, retaining the solid in each centrifuge tube. ~5 ml of hexane was added to the solid in each centrifuge tube and the contents of each centrifuge tube were mixed using a vortexer. After mixing, each centrifuge tube was centrifuged again. The supernatant liquid from each centrifuge tube was transferred to a separate clean tube; the solids in each centrifuge tube were discarded. Cores were precipitated from the supernatant liquid in each of the separate tubes by adding excess butanol (20-25 ml) with stirring. The new tubes containing the precipitated cores were centrifuged, the supernatant liquid decanted, leaving precipitated cores in each tube. ~5-6 ml anhydrous hexane were added to the precipitated cores in each tube to solvate the cores and the contents of each tube was filtered through a 0.2 micron filter. (The cores are in the filtrate.)

A 2.5 µl aliquot of the filtrate was diluted 100 fold with anhydrous hexane and a UV VIS spectrum of the diluted aliquot was measured and absorbance at 350 nm measured.

Characterization of the Cores:
first peak 460 nm, abs=0.0267, at 350 nm, abs=0.176
maximum peak emission—466 nm
FWHM 15 nm
Photoluminescence quantum efficiency ~20%

Example 3B

Shell Preparation (ZnS)

5 ml of 97% trioctylphosphine and 5 ml of oleylamine (distilled prior to use), were placed in a 4 necked flask equipped with a condenser and thermocouple. The sample was stirred and degassed at 100° C. for ~1 hour. After introducing $N_2$ to the flask and reducing the temperature to 80° C., 4.5 ml of hexane containing core (see Example 1A above) was added and the solvent removed under vacuo for 2 hours. The temperature was raised to 170° C. and bis-trimethylsilylsulfide (49.6 mg) in 4 ml of TOP and diethylzinc (17.2 mg) in 4 ml of TOP were added from separate syringes at a rate of 50 microliters/minute. The solution in the flask was observed to develop a bluish color. After addition was complete, the solution looked cloudy. The sample was transferred via a degassed vial into an inert atmosphere box.

The cores including a ZnS shell were purified by precipitation as follows. (In this example, the precipitation step was carried out two times for each sample.) The solution was divided into 2 centrifuge tubes. Excess butanol (~20-30 ml) was added to each centrifuge tube. The centrifuge tubes were centrifuged for 5 minutes at 4000 rpm. After centrifuging, the supernatant liquid was poured off, retaining the solid in each centrifuge tube. ~5 ml of hexane was added to the solid in each centrifuge tube and the contents of each centrifuge tube were mixed using a vortexer. Semiconductor nanocrystals comprising a core and a ZnS shell disposed over the core were precipitated by adding excess butanol (20-25 ml) with stifling. The centrifuge tube contents were centrifuged. The supernatant liquid was decanted, leaving the semiconductor nanocrystals in the centrifuge tubes. ~5 ml anhydrous hexane were added to the semiconductor nanocrystals in one of the centrifuge tubes to solvate the semiconductor nanocrystals. The hexane including the solvated semiconductor nanocrystals was then transferred into the second centrifuge tube to solvate the semiconductor nanocrystals contained therein. The mixture including the hexane and the semiconductor nanocrystals from both centrifuge tubes was filtered through a 0.2 micron filter. (The overcoated cores are in the filtrate.)

Characterization of the Core/Shell Nanocrystals:
maximum peak emission—470 nm
FWHM 17 nm
Photoluminescence quantum efficiency ~59%

Example 4A

Core Preparation 0.025 g CdO (99.998% Alfa) and 0.035 g of ZnO (99.999% Sigma Aldrich) were weighed into a three necked flask equipped with a condenser. To this was added: 2 ml tech grade oleic acid (Aldrich) and 16 ml of tech grade octadecene (ODE) (Aldrich). The content of the flask was degassed at 80° C. for 20 minutes in vacuo (200 millitorr).

Separately 0.035 g of sulfur (99.999% Strem) was dissolved in 10 ml of tech grade ODE in a septum capped vial by stifling and heating in an oil bath to 130° C. While the sample was heating up, the pressure of the vessel was reduced to 200 millitorr until the oil bath temperature was 85° C., then further heating was continued under nitrogen. After 1 hour, when all the sulfur was dissolved, the sample was cooled to room temperature.

The contents of the three necked flask were stirred and heated to 310° C. under nitrogen until all the oxides dissolved to give a clear solution. The temperature controller was then set to 300° C. and once the temperature stabilized at 300° C., approximately 4.0 ml of S in ODE was rapidly injected. The temperature of the solution fell to about 270° C. and climbed back to 300° C. in ~30 minutes. The reaction was stopped after 4 hours and the contents of the flask were transferred to a degassed vial under nitrogen and transferred to an inert atmosphere box for further purification.

The cores were purified by precipitation as follows. (In this example, the precipitation step was carried out two times for each sample.) The solution was divided in half; each half was added to a separate centrifuge tube. Excess butanol (~20-30 ml) was added to each centrifuge tube. Each tube was then centrifuged for 5 min, 4000 rpm. After centrifuging, the supernatant liquid was poured off, retaining the solid in each centrifuge tube. ~5 ml of hexane was added to the solid in each centrifuge tube and the contents of each centrifuge tube were mixed using a vortexer. After mixing, each centrifuge tube was centrifuged again. The supernatant liquid from each centrifuge tube was transferred to a separate clean tube; the solids in each centrifuge tube were discarded. Cores were precipitated from the supernatant liquid in each of the separate tubes by adding excess butanol (20-25 ml) with stirring. The new tubes containing the precipitated cores were centrifuged, the supernatant liquid decanted, leaving precipitated cores in each tube. ~5-6 ml anhydrous hexane was added to the precipitated cores in each tube to solvate the cores and the contents of each tube was filtered through a 0.2 micron filter. (The cores are in the filtrate.)

A 2.5 µl aliquot of the filtrate was diluted 100 fold with anhydrous hexane and a UV VIS spectrum of the diluted aliquot was measured and absorbance at 350 nm measured.

Characterization of the Cores:
first peak 454 nm, abs=0.11, at 350 nm, abs=0.652
maximum peak emission—459 nm
FWHM 16 nm
Photoluminescence quantum efficiency ~28%

Example 4B

Shell Preparation (ZnS)

5 ml of 97% trioctylphosphine and 5 ml of oleylamine (distilled prior to use), were placed in a 4 necked flask equipped with a condenser and thermocouple. The sample was stirred and degassed at 100° C. for ~1 hour. After introducing N2 to the flask and reducing the temperature to 80° C., 2.4 ml of hexane containing core (see example 1 above) was added and the solvent removed under vacuo for 2 hours. The temperature was raised to 170° C. and bis-trimethylsilylsulfide (106.5 mg) in 4 ml of TOP and diethylzinc (36.8 mg) in 4 ml of TOP were added from separate syringes at 50 microliters/minute. The solution in the flask was observed to develop a bluish color and after addition was complete the solution looked cloudy. The sample was transferred via a degassed vial into an inert atmosphere box.

The cores including a ZnS shell were purified by precipitation as follows. (In this example, the precipitation step was carried out two times for each sample.) The solution was divided into 2 centrifuge tubes. Excess butanol (~20-30 ml) was added to each centrifuge tube. The centrifuge tubes were centrifuged for 5 minutes at 4000 rpm. After centrifuging, the supernatant liquid was poured off, retaining the solid in each centrifuge tube. ~5 ml of hexane was added to the solid in each centrifuge tube and the contents of each centrifuge tube were mixed using a vortexer. Semiconductor nanocrystals comprising a core and a ZnS shell disposed over the core were precipitated by adding excess butanol (20-25 ml) with stifling. The centrifuge tube contents were centrifuged. The supernatant liquid was decanted, leaving the semiconductor nanocrystals in the centrifuge tubes. ~5 ml anhydrous hexane were added to the semiconductor nanocrystals in one of the centrifuge tubes to solvate the semiconductor nanocrystals. The hexane including the solvated semiconductor nanocrystals was then transferred into the second centrifuge tube to solvate the semiconductor nanocrystals contained therein. The mixture including the hexane and the semiconductor nanocrystals from both centrifuge tubes was filtered through a 0.2 micron filter. (The overcoated cores are in the filtrate.)
Characterization of the Core/Shell Nanocrystals:
    maximum peak emission—462 nm
    FWHM 18 nm
    Photoluminescence quantum efficiency ~67%

Example 5A

Core Preparation 0.050 g CdO (99.998% purity—Alfa) and 0.066 g of ZnO (99.999% purity—Sigma Aldrich) were weighed into a three necked flask equipped with a condenser. To this was added: 4 ml tech grade oleic acid (Aldrich) and 32 ml of tech grade octadecene (ODE) (Aldrich). The contents of the flask were degassed at 80° C. for 20 minutes in vacuo (200 millitorr).

Separately 0.035 g of sulfur (99.999% Strem) was dissolved in 10 ml of tech grade ODE in a septum capped vial by stifling and heating in an oil bath to 130° C. While the sample was heating up, the pressure of the vessel was reduced to 200 millitorr until the oil bath temperature was 85° C., then further heating was continued under nitrogen. After 1 hour, when all the sulfur was dissolved, the sample was cooled to room temperature.

The contents of the three necked flask were stirred and heated, under nitrogen, to 290° C. for 20 minutes then to 310° C., until all the oxides dissolved to give a clear solution. The temperature controller was then set to 300° C. and once the temperature stabilized at 300° C., approximately 8.0 ml of S in ODE was rapidly injected. The temperature of the solution fell to about 270° C. and climbed back to 300° C. in ~30 minutes. The reaction was stopped after 5 hours and the contents of the flask were transferred to a degassed vial under nitrogen and transferred to an inert atmosphere box for further purification.

The cores were purified by precipitation as follows. The solution was centrifuged for 5 min, 4000 rpm. After centrifuging, the supernatant liquid was poured off, retaining the solid in the centrifuge tube. ~10 ml methanol was added to the tube and then decanted. ~10 ml of anhydrous hexane was thereafter added to the solid in the centrifuge tube and the contents of the tube were mixed using a vortexer. After mixing, the contents of the tube were centrifuged. The supernatant liquid was transferred to a separate clean tube; the solids in the tube after centrifuging were discarded. Cores were precipitated from the supernatant liquid by adding excess butanol (20-25 ml) with stirring. The tube containing the precipitated cores was centrifuged, the supernatant liquid decanted, leaving precipitated cores in the tube. ~7.5 ml anhydrous hexane were added to the precipitated cores to solvate the cores and the contents of the tube were filtered through a 0.2 micron filter. (The cores are in the filtrate.)

A 2.5 µl aliquot of the filtrate was diluted 100 fold with anhydrous hexane and a UV VIS spectrum of the diluted aliquot was measured and absorbance at 350 nm measured.
Characterization of the Cores:
maximum peak emission—461 nm
FWHM=14 nm
Photoluminescence quantum efficiency=~17%

Example 5B

Shell Preparation (ZnS)

5 ml of 97% trioctylphosphine and 5 ml of oleylamine (distilled prior to use), were placed in a 4 necked flask equipped with a condenser and thermocouple. The sample was stirred and degassed at 100° C. for ~1 hour. After introducing $N_2$ to the flask and reducing the temperature to 80° C., 3.8 ml of anhydrous hexane containing cores (see Example 5A above) was added and the solvent removed under vacuo for 2 hours. The temperature was raised to 170° C. and bis-trimethylsilylsulfide (92.53 mg) in 4 ml of TOP and diethylzinc (32.00 mg) in 4 ml of TOP were added from separate syringes at a rate of 50 microliters/minute. The solution in the flask was observed to develop a bluish color. After addition was complete, the solution looked cloudy. The sample was transferred via a degassed vial into an inert atmosphere box.

The cores including a ZnS shell were purified by precipitation as follows. The sample was transferred to Tube 1 and centrifuged for 5 minutes at 4000 rpm. Tube 1 (Batch 1):

After centrifuging, the supernatant liquid was poured off into Tube 2, retaining the solid in Tube 1. ~5 ml of anhydrous hexane was added to the solid in centrifuge Tube 1 and the contents were mixed using a vortexer. Semiconductor nanocrystals comprising a core and a ZnS shell disposed over the core were precipitated by adding excess butanol (20-25 ml) with stirring. The Tube 1 contents were centrifuged. The supernatant liquid was decanted, leaving the semiconductor nanocrystals in the centrifuge tubes. ~3 ml anhydrous hexane were added to the semiconductor nanocrystals in Tube 1 to solvate the semiconductor nanocrystals. The mixture including the anhydrous hexane and the semiconductor nanocrystals from centrifuge tube 1 was filtered through a 0.2 micron filter. (The overcoated cores are in the filtrate.)

Tube 2 (Batch 2):

Excess butanol (~20-30 ml) was added to Tube 2. Tube 2 was centrifuged for 5 minutes at 4000 rpm. After centrifuging, the supernatant liquid was poured off, retaining the solid in the centrifuge tube. ~5 ml of anhydrous hexane was added to the solid in each centrifuge tube and the contents of each centrifuge tube were mixed using a vortexer. Semiconductor nanocrystals comprising a core and a ZnS shell disposed over the core were precipitated by adding excess butanol (20-25 ml) with stirring. The centrifuge tube contents were centrifuged. The supernatant liquid was decanted, leaving the semiconductor nanocrystals in the centrifuge tubes. ~3 ml anhydrous hexane were added to the semiconductor nanocrystals in one of the centrifuge tubes to solvate the semiconductor nanocrystals. The mixture including the anhydrous hexane and the semiconductor nanocrystals from both centrifuge tubes was filtered through a 0.2 micron filter. (The overcoated cores are in the filtrate.)
Characterization of the Core/Shell Nanocrystals:
maximum peak emission 463 nm
FWHM=18 nm
Photoluminescence quantum efficiency ~100%—(Batches 1 & 2)

Example 5C

Shell Preparation in TOPO 5 grams of 99% trioctylphosphine oxide and 5 ml of oleylamine (distilled prior to use), were placed in a 4 necked flask equipped with a condenser and thermocouple. The sample was stirred and degassed at 100° C. for ~1 hour. After introducing $N_2$ to the flask and reducing the temperature to 80° C., 3.8 ml of anhydrous hexane containing cores (see Example 5A above) was added and the solvent removed under vacuo for 2 hours. The temperature was raised to 170° C. and bis-trimethylsilylsulfide (92.53 mg) in 4 ml of TOP and diethylzinc (32.00 mg) in 4 ml of TOP were added from separate syringes at a rate of 50 microliters/minute. The solution in the flask was observed to develop a yellow-green color. After addition was complete, the solution looked cloudy. The sample was transferred via a degassed vial into an inert atmosphere box.

The cores including a ZnS shell prepared in TOPO were purified by precipitation as follows. (In this example, the precipitation step was carried out two times for each sample) as follows. ~5 ml of anhydrous hexane was added to the solid in the degassed vial and 5 ml of solution was added to each of two tubes. Semiconductor nanocrystals comprising a core and a ZnS shell disposed over the core were precipitated by adding 20 ml of a 3:1 anhydrous methanol/isopropanol mixture to each of the two tubes, following which the supernatant liquid was decanted, leaving the semiconductor nanocrystals in the centrifuge tubes. ~3 ml anhydrous hexane were added to the semiconductor nanocrystals in each of the centrifuge tubes to solvate the semiconductor nanocrystals, which were then re-precipitated by the addition of 5 ml of a 3:1 anhydrous methanol/isopropanol mixture. The re-precipitated semiconductor nanocrystals were centrifuged to separate and recover the nanocrystals. After the supernatant liquid was removed, the nanocrystals were solvated in 3 ml anhydrous hexane. The mixture including the anhydrous hexane and the semiconductor nanocrystals from both centrifuge tubes was filtered through a 0.2 micron filter. (The overcoated cores are in the filtrate.)
Characterization of the Core/Shell Nanocrystals:
maximum peak emission 464 nm
FWHM=18
Photoluminescence quantum efficiency 79%

The $Zn_xCd_{1-x}S$ cores prepared in Examples 1A, 2A, and 3A demonstrate a maximum peak emission at a wavelength in a range from about 433 to about 478 nm and a FWHM in a range from about 14 to about 18 nm. The photoluminescence quantum efficiencies for the cores prepared in Examples 1A, 2A, and 3A (under nitrogen varied) range from about 20% to about 40%. For these core samples, the measured photoluminescence quantum yield increased with zinc content. Additionally, the maximum peak emission demonstrated a blue shift as more zinc was incorporated in the core. This is consistent with an alloyed composition.

After overcoating the cores with ZnS by a suitable overcoating process (such as, for example, that described above), the photoluminescence quantum efficiency of the ZnS treated cores increased from about 20-50% (for the cores alone) to from about 59 to about 100%.

The ZnS treated cores are believed to have a core/shell structure based on the observation of a red shift of the maximum peak emission of the ZnS treated cores compared to the cores that have not undergone the overcoating process.

Examples 1-5

Determination of Photoluminescence Quantum Efficiency (PLQE)

Diphenyl anthracene (DPA) was used to prepare standards of various concentrations by dissolving DPA in cyclohexane in amounts appropriate to prepare the desired concentrations. The absorbance of each of the standards was measured at 373 nm, and the emission area was measured after excitation at 373 nm. For example, a series of standards of varying concentrations were prepared as described above and the following absorbance values were obtained for the standards at 373 nm: 0.135, 0.074, 0.044 and 0.023. A straight line was plotted between emission and absorbance to get a slope. The slope obtained from a straight line plot of the four absorbance measurements listed above was ~73661 arbitrary units. The measurements were made on a CARY Eclipse spectrophotometer. The CARY Eclipse settings used when taking the measurements were:

| Data mode | Fluorescence |
|---|---|
| Scan mode | Emission |
| X Mode | Wavelength (nm) |
| Start (nm) | 383.00 |
| Stop (nm) | 700.00 |
| Ex. Wavelength (nm) | 373.00 |
| Ex. Slit (nm) | 2.5 |
| Em. Slit (nm) | 2.5 |
| Scan rate (nm/min) | 600.00 |
| Data interval (nm) | 1.0000 |
| Averaging Time (s) | 0.1000 |
| Excitation filter | Auto |
| Emission filter | Open |
| PMT voltage (V) | Medium |
| Corrected spectra | OFF |

Other settings can be used and can be readily determined by one of ordinary skill in the art. Other brand spectrophotometers can be used to measure PL quantum efficiency and the settings to be used can be readily determined by one of ordinary skill in the art.

Example 6A

Synthesis of CdZnSe Nanocrystal Core (1:30:60 Cd:Zn:Se Ratio)

10 mg CdO (F.W.=128.41) (99.998% purity—Alfa) (0.077 mmol Cd) and 50 mg Octylphosphonic Acid (F.W.=194.2; Poly Carbon Industries) are added to a 50 ml three necked round bottom flask and attached to a vacuum line. 11.25 mL of Octadecene (ODE) is added to the 50 ml round bottom flask using a 20 mL syringe equipped with blunt needle (Fluka 95%) and 3.75 mL of Oleylamine (also known as 1-Amino-9-octadecene) is added to the 50 ml bottom flask using a 5 mL syringe equipped with blunt needle. (The oleylamine is vacuum distilled prior to use.) The mixture is degassed at 100° C. for ~1 hr. The flask is then heated to 310° C. until the mixture turns clear (Cd phosphonate is formed). Once the solution is clear, the solution temperature is dropped to 120° C. and degassed for another few cycles of evacuate/refill with $N_2$.

1.3 mL Octadecene (ODE), 4.7 mL of TOPSe (1M) (4.7 mmol Se), and 288 mg $ZnEt_2$ (F.W.=123.49) (2.34 mmol Zn) are placed into a 20 mL vial in a nitrogen glove box. The solution is mixed and drawn into one 10 mL syringe and removed from the glove box.

The Cd-containing solution in the 50 ml three neck round bottom flask is heated to 305° C. and the Zn and Se containing solution is rapidly injected into the pot using the large stainless steel syringe needles. The reaction is allowed to run overnight at 290° C. for approximately 16 hrs. (The reaction can also be run for longer times, e.g., 25 hours or longer.)

After 16 hours, the absorbance should be about 418 nm and a FWHM of 25 nm can be obtained.

Clean Up of Nanocrystal Cores:

The crude nanocrystal cores are further processed in a glove box environment. About 2.5-3 ml (about 0.05 mmol) of the crude core growth solution is added to a 50 ml centrifuge tube. Excess butanol (about 30 ml) is slowly added to the tube while stirring. About 10 ml methanol is then slowly added to the tube while stirring. The mixture is Vortexed to ensure thorough washing and mixing and to separate the nanocrystal cores. The supernatant is poured off, and the nanocrystal cores are dispersed in 2-4 ml hexane. The mixture is filtered and the nanocrystal cores are diluted 100 fold. Preferably, concentrated hexane is completely degassed prior to being injected into the pot mixture. Recovery of nanocrystal cores from the supernatant can be increased by adding additional MeOH and Butanol.

Example 6B

Overcoating the CdZnSe Cores Prepared in Example 6A

Three mL syringes are prepared in the glove box with the precursors for the shell.

The first syringe: about 11 mg of $CdMe_2$; and 1 mL of TOP.

The second syringe: 77 mg of $ZnEt_2$ and 3 mL of TOP.

The third syringe: 230 mg of $(TMS)_2S$ and 3 mL of TOP.

The shell precursor mixture for each syringe is prepared by placing the Tri-n-octylphosphine (TOP) into an 8 mL glass vial. The precursors (dimethylcadmium, diethylzinc ($ZnEt_2$) and Bis(TMS)sulfide ($(TMS)_2S$)) are then dripped into the Tri-n-octylphosphine using a syringe until the right weight of material has been added to each vial. The solution is mixed gently with the vial capped and then drawn up into the 5 mL syringe. The amounts of precursors are calculated based on approximately 5 monolayers including 30% Cd and about 8 monolayers of ZnS, regardless of the actual shell composition and structure.

Micro capillary tubing is then loaded onto each syringe and a small amount of solution is pushed through to clear the tubing of nitrogen (this is all done inside the glove box).

Ten (10) grams of Tri-n-octylphosphine oxide (TOPO) (99% Strem) and 0.8 grams of octadecylphosphonic acid (ODPA) (Polycarbon Industries) are added to a 4 neck 50 mL round bottom flask including a football-shaped magnetic stirrer bar. The flask is also equipped with a rubber septum on two of the four necks, a distillation column on the middle neck and the temperature probe in the last neck. The contents of the flask are heated to about 120° C. while under nitrogen. When the temperature reaches about 120° C., the nitrogen line is closed, and the flask is slowly opened up to vacuum. The contents of the flask are degassed under vacuum at 120° C. for roughly 1.5 hours. When the solution in the round bottom flask has finished degassing, the vacuum is closed and the flask is opened up to nitrogen. The temperature of the flask is set to 80° C. The cores prepared as described in Example 1A in hexane are added to the round bottom flask using a 5 mL syringe. The vacuum is slowly opened up and all of the hexane is removed from the flask, leaving behind the cores (this can take as long as 2 hours). When all of the hexane has been removed, the vacuum is closed and the flask is opened up to nitrogen and the temperature brought down to 80° C. Approximately 15 min prior to introducing the shell precursors, about 0.48 ml of decylamine (DA). (using 1 ml syringe) is added and the temperature is increased to 170° C. under nitrogen. Once the temperature of the flask reaches 170° C., the syringes are loaded into syringe pumps to introduce the three lines into the flask (one going through each septum, so that the micro capillary tubing is hugging the flask wall and about 0.5 cm submerged into the stirring solution).

With the flask at 170° C., the syringe pumps are turned on and the three solutions are pumped into the flask at a rate of 50 µL/min. with rapid stifling. All of the Cd-precursor is added in about 20 minutes (during which time Zn-precursor and S-precursor are also added) Zn-precursor and S-precursor additions continue over another 40 minutes. Optionally, when all of the overcoating solutions from the three syringes has been added to the flask, the syringe pump lines are removed from the flask, the temperature is turned down to 100° C., and 10 ml of toluene is added and allowed to sit overnight under nitrogen.

Results/Characterization:

Crude mixture for this core/shell composition and structure should have an emission maximum of approximately 460 nm with a FWHM of ~30 nm.

Clean Up of Core-Shell Particles:

The total growth solution is divided into two aliquots, each being put into a 50 mL centrifuge tube. 2 ml of hexane is added to each and stirred, followed by an addition of 2 ml of butanol to each and stifling. An excess ~20 ml of methanol is added to each centrifuge tube with stifling. The centrifuge tubes are centrifuged 5 minutes at about 3900 rpm. The particles in each tube are dispersed in about 10 ml of hexane with stifling using a vortexer. The centrifuge tubes are then centrifuged for 5 minutes at about 3900 rpm. The supernatant includes the hexane and the overcoated cores. The supernatant is collected from each tube and is placed into another two centrifuge tubes. (The solid is a salt that has formed and is waste.) The hexane/overcoated core supernatant is filtered using a 0.2 µm syringe filter. A small amount of butanol (~1 m) is added to each tube and stirred well, followed by an addition of enough methanol to each tube to cause the solution to become cloudy (~8 mL). An additional ~5 mL of methanol is added to each tube after reaching the cloudy point. The tubes are centrifuged for 5 minutes at about 3900 rpm. The supernatant is poured off. The purified overcoated cores are now at the bottom of the tube and the supernatant is waste. The overcoated cores are dispersed in a minimal amount of chloroform (~2-4 mL) (preferably anhydrous). The overcoated cores/chloroform dispersion is filtered with a 0.2 micron syringe filter. The filtered overcoated cores/chloroform dispersion is placed into an 8 or 20 mL vial.

Results/Characterization:

The cleaned-up core/shell dispersion in chloroform can have an emission maximum of approximately 460 nm with a FWHM of ~26 nm.

Examples 7-11

The following overcoating examples 7-11 were carried out using cores prepared substantially in accordance with the procedure of Example 6A.

The shell overcoating procedure for each example was carried out substantially as described in Example 6B with the ingredients and precursors listed below; each listed ingredient or precursor being used in amounts approximating those given for the same ingredients and precursors in Examples 6B. (If any reagent or precursor included in Examples 6B was not included in any of Examples 7-11, it is not listed.)

| EXAMPLE | 4 NECK 50 ml ROUND BOTTOM FLASK INGREDIENTS | SHELL PRE-CURSORS | RESULTS Emission Maximum (FWHM) Solution Quantum Yield, QY |
|---|---|---|---|
| 7 | Core ODPA DA | Cd-precursor Zn-precursor S-precursor | 460 nm (FWHM = 31), QY 70%, 60% (The overcoated cores were cleaned up 4 times) |
| 8 | Core ODPA | Cd-precursor Zn-precursor S-precursor | 464 nm (FWHM = 37) (The overcoated cores were cleaned up 2 times) QY 55% (under $N_2$), 32%(after opening to air) The overcoated cores were cleaned up 2 times) |
| 9 | Core DA | Cd-precursor Zn-precursor S-precursor | 433 nm (FWHM = 25) QY 10% (after opening to air) The overcoated cores were cleaned up 2 times) |
| 10 | Core (FWHJ = 421) ODPA DA | Cd-precursor S-precursor | 465 nm (FWHM = 40) QY 29% The overcoated cores were cleaned up 2 times) |
| 11 | Core (FWHM = 421) ODPA DA | Zn-precursor S-precursor | 419 nm (FWHM = 27) QY 26% The overcoated cores were cleaned up 2 times) |

Example 6-11

Determination of Photoluminescence Quantum Efficiency (PLQE)

Diphenyl anthracene (DPA) is used to prepare standards of various concentrations by dissolving DPA in cyclohexane in amounts appropriate to prepare the desired concentrations. The absorbance of each of the standards is measured at 373 nm, and the emission area is measured after excitation at 373 nm. For example, a series of standards of varying concentrations were prepared as described above and the following absorbance values were obtained for the standards at 373 nm: 0.135, 0.074, 0.044 and 0.023. A straight line was plotted between emission and absorbance to get a slope. The slope obtained from a straight line plot of the four absorbance measurements listed above was ~73661 units. The measurements were made on a CARY Eclipse spectrophotometer. The CARY Eclipse settings used when taking the measurements were:

| Data mode | Fluorescence |
|---|---|
| Scan mode | Emission |
| X Mode | Wavelength (nm) |
| Start (nm) | 383.00 |
| Stop (nm) | 700.00 |
| Ex. Wavelength (nm) | 373.00 |
| Ex. Slit (nm) | 2.5 |
| Em. Slit (nm) | 2.5 |
| Scan rate (nm/min) | 600.00 |
| Data interval (nm) | 1.0000 |
| Averaging Time (s) | 0.1000 |
| Excitation filter | Auto |
| Emission filter | Open |
| PMT voltage (V) | Medium |
| Corrected spectra | OFF |

Other settings can be used and can be readily determined by one of ordinary skill in the art. Other brand spectrophotometers can be used to measure PL quantum efficiency and the settings to be used can be readily determined by one of ordinary skill in the art.

Semiconductor nanocrystals for which the % photoluminescence quantum efficiency is to be measured are dispersed in hexane and the absorbance at 373 nm is measured. The sample is excited at 373 nm using the same conditions as the standard and the emission area is measured.

Photoluminescence quantum yield can be calculated using the following equation:

$$PLQE = \{[\text{maximum peak emission area of semiconductor nanocrystal} \times 0.90 \times (1.375)^2]\} / \{[\text{slope of line plot for standards} \times \text{absorbance of semiconductor nanocrystal at 373 nm} \times (1.423)^2]\}$$

wherein, 0.90 is the PLQE of the standard used (DPA); 1.375 is the refractive index of hexane, 1.423 is the refractive index of cyclohexane, % Photoluminescence quantum yield can be calculated from the PLQE value using the following equation:

$$\% PLQE = 100 \times PLQE.$$

Preferably, the standard comprises an organic dye the photoluminescence spectrum of which overlaps significantly with that of the semiconductor nanocrystal sample. The standard samples and the semiconductor nanocrystal sample(s) are measured under the same settings of the spectrophotometer.

Semiconductor nanocrystals show strong quantum confinement effects that can be harnessed in designing bottom-up chemical approaches to create complex heterostructures with electronic and optical properties that are tunable with the size and composition of the semiconductor nanocrystals.

When an electron and hole localize on a semiconductor nanocrystal, emission can occur at an emission wavelength. The emission has a frequency that corresponds to the band gap of the quantum confined semiconductor material. The band gap is a function of the size of the semiconductor nanocrystal. Semiconductor nanocrystals having small diameters can have properties intermediate between molecular and bulk forms of matter. For example, semiconductor nanocrystals based on semiconductor materials having small diameters can exhibit quantum confinement of both the electron and hole in all three dimensions, which leads to an increase in the effective band gap of the material with decreasing nanocrystal size. Consequently, both the optical absorption and emission of semiconductor nanocrystals shift to the blue, or to higher energies, as the size of the nanocrystal decreases.

The emission from a semiconductor nanocrystal can be a narrow Gaussian emission band that can be tuned through the complete wavelength range of the ultraviolet, visible, or infra-red regions of the spectrum by varying the size of the semiconductor nanocrystal, the composition of the semiconductor nanocrystal, or both. For example, CdSe can be tuned in the visible region and InAs can be tuned in the infra-red region.

In certain embodiments, a population of semiconductor nanocrystals can have a narrow size distribution that can result in emission of light in a narrow spectral range. The population can be monodisperse preferably exhibits less than a 15% rms (root-mean-square) deviation in diameter of the semiconductor nanocrystals, more preferably less than 10%, most preferably less than 5%. In certain embodiments, spectral emissions in a narrow range of not greater than about 75 nm, more preferably not greater than about 60 nm, still more preferably not greater than about 40 nm, and most preferably not greater than about 30 nm full width at half max (FWHM) for semiconductor nanocrystals that emit in the visible can be observed. IR-emitting semiconductor nanocrystals preferably have a FWHM of not greater than about 150 nm, or more preferably not greater than about 100 nm. In certain embodiments, expressed in terms of the energy of the emission, an emission can have a FWHM of not greater than 0.05 eV, or not greater than 0.03 eV. The breadth of the emission decreases as the dispersity of semiconductor nanocrystal diameters decreases.

The narrow FWHM of semiconductor nanocrystals can result in saturated color emission. This can lead to efficient lighting devices even in the red and blue parts of the visible spectrum, since in semiconductor nanocrystal emitting devices no photons are lost to infra-red and UV emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A device including semiconductor nanocrystals of different compositions, sizes, and/or structures can emit light in more than one narrow range of wavelengths. The color of emitted light perceived by a viewer can be controlled by selecting appropriate combinations of semiconductor nanocrystal sizes and materials in the device as well as relative subpixel currents. The degeneracy of the band edge energy levels of semiconductor nanocrystals facilitates capture and radiative recombination of all possible excitons, whether generated by direct charge injection or energy transfer. The maximum theoretical semiconductor nanocrystal lighting device efficiencies are therefore comparable to the unity efficiency of phosphorescent organic light-emitting devices. The excited state lifetime ($\tau$) of the semiconductor nanocrystal is much shorter ($\tau\sim10$ ns) than a typical phosphor ($\tau>0.1$ µs), enabling semiconductor nanocrystal lighting devices to operate efficiently even at high current density and high brightness.

Semiconductor nanocrystals can be suitable for a variety of applications, including those disclosed in U.S. patent application Ser. No. 09/156,863, filed Sep. 18, 1998 (now U.S. Pat. No. 6,251,303), Ser. No. 09/160,454, filed Sep. 24, 1998 (now U.S. Pat. No. 6,326,144), Ser. No. 09/160,458, filed Sep. 24, 1998 (now U.S. Pat. No. 6,617,583), Ser. No. 09/350,956, filed Jul. 9, 1999 (now U.S. Pat. No. 6,803,719), and Ser. No. 10/400,908, filed Mar. 28, 2003 (U.S. Published Patent Application No. 20040023010), all of which are incorporated herein by reference in their entirety.

For example, the nanocrystals can be used in a variety of end-use applications and products. Such end-use applications and product include, but are not limited to, optoelectronic devices including light emitting diodes (LEDs) or alternating current devices (ACTFELDs), lasers, biomedical tags, photoelectric devices, solar cells, catalysts, and the like. Light-emitting devices including nanocrystals in accordance with the present invention may be incorporated into a wide variety of consumer products, including, but not limited to, flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control such devices, including passive matrix and active matrix.

Light-emitting devices including semiconductor nanocrystals can be made by spin-casting a solution containing the hole transport layer (HTL) organic semiconductor molecules and the semiconductor nanocrystals, where the HTL forms underneath the semiconductor nanocrystal layer via phase separation (see, for example, U.S. patent application Ser. No. 10/400,907 (now U.S. Pat. No. 7,332,211) and Ser. No. 10/400,908 (now U.S. Pat. No. 7,700,200), both filed Mar. 28, 2003, each of which is incorporated by reference in its entirety). In certain embodiments, this phase separation technique can be used to place a monolayer of semiconductor nanocrystals between an organic semiconductor HTL and electron transport layer (ETL), thereby effectively exploiting the favorable light emission properties of semiconductor nanocrystals, while minimizing their impact on electrical performance. Other techniques for depositing semiconductor nanocrystals include Langmuir-Blodgett techniques and drop-casting. Some techniques for depositing semiconductor nanocrystals may not be well suited for all possible substrate materials, may involve use of chemicals that can affect the electrical or optical properties of the layer, may subject the substrate to harsh conditions, and/or may place constraints on the types of devices that can be grown in some way. Other techniques discussed below may be preferable if a patterned layer of semiconductor nanocrystals is desired.

Preferably, semiconductor nanocrystals are processed in a controlled (oxygen-free and moisture-free) environment, preventing the quenching of luminescent efficiency during the fabrication process.

In certain embodiments, semiconductor nanocrystals can be deposited in a patterned arrangement. Patterned semiconductor nanocrystals can be used to form an array of pixels comprising, e.g., red, green, and blue or alternatively, red, yellow, green, blue-green, and/or blue emitting, or other combinations of distinguishable color emitting subpixels, that are energized to produce light of a predetermined wavelength.

An example of a technique for depositing a light-emitting material comprising semiconductor nanocrystals in a pattern and/or in a multi-color pattern or other array is contact printing. Contact printing advantageously allows micron-scale (e.g., less than 1 mm, less than 500 microns, less than 200 microns, less than 100 microns, less than 50 microns, less than 25 microns, or less than 10 microns) patterning of features on a surface. Pattern features can also be applied at larger scales, such as 1 mm or greater, 1 cm or greater, 1 m or greater, 10 m or greater. Contact printing can allow dry (e.g., liquid free or substantially liquid free) application of a patterned semiconductor nanocrystal layer to a surface. In a pixilated device, the semiconductor nanocrystal layer comprises a patterned array of the semiconductor nanocrystals on the underlying layer. In instances where a pixel includes subpixels, the sizes of the subpixels can be a proportionate fraction of the pixel size, based on the number of subpixels.

Additional information and methods for depositing semiconductor nanocrystals are described in U.S. patent application Ser. No. 11/253,612 entitled "Method And System For Transferring A Patterned Material", filed 20 Oct. 2005 (U.S. Published Application No. 20060196375A1), and Ser. No. 11/253,595 entitled "Light Emitting Device Including Semiconductor Nanocrystals", filed 20 Oct. 2005 (U.S. Published Application No. 20080001167A1), each of which is hereby incorporated herein by reference in its entirety.

Other materials, techniques, methods, applications, and information that may be useful with the present invention are described in, U.S. Provisional Patent Application No. 60/792,170, of Seth Coe-Sullivan, et al., for "Composition Including Material, Methods Of Depositing Material, Articles Including Same And Systems For Depositing Material", filed on 14 Apr. 2006; U.S. Provisional Patent Application No. 60/792,084, of Maria J. Anc, For "Methods Of Depositing Material, Methods Of Making A Device, And System", filed on 14 Apr. 2006, U.S. Provisional Patent Application No. 60/792,086, of Marshall Cox, et al, for "Methods Of Depositing Nanomaterial & Methods Of Making A Device" filed on 14 Apr. 2006; U.S. Provisional Patent Application No. 60/792,167 of Seth Coe-Sullivan, et al, for "Articles For Depositing Materials, Transfer Surfaces, And Methods" filed on 14 Apr. 2006, U.S. Provisional Patent Application No. 60/792,083 of LeeAnn Kim et al., for "Applicator For Depositing Materials And Methods" filed on 14 Apr. 2006; U.S. Provisional Patent Application 60/793,990 of LeeAnn Kim et al., for "Applicator For Depositing Materials And Methods" filed by Express Mail on 21 Apr. 2006; U.S. Provisional Patent Application No. 60/790,393 of Seth Coe-Sullivan et al., for "Methods And Articles Including Nanomaterial", filed on 7 Apr. 2006; U.S. Provisional Patent Application No. 60/805,735 of Seth Coe-Sullivan, for "Methods For Depositing Nanomaterial, Methods For Fabricating A Device, And Methods For Fabricating An Array Of Devices", filed on 24 Jun. 2006; U.S. Provisional Patent Application No. 60/805,736 of Seth Coe-Sullivan et al., for "Methods For Depositing Nanomaterial, Methods For Fabricating A Device, Methods For Fabricating An Array Of Devices And Compositions", filed on 24 Jun. 2006; U.S. Provisional Patent Application No. 60/805,738 of Seth Coe-Sullivan et al., for "Methods And Articles Including Nanomaterial", filed on 24 Jun. 2006; U.S. Provisional Patent Application No. 60/795,420 of Paul Beatty et al., for "Device Including Semiconductor Nanocrystals And A Layer Including A Doped Organic Material And Methods", filed on 27 Apr. 2006; U.S. Provisional Patent Application No. 60/804,921 of Seth Coe-Sullivan et al., for "Light-Emitting Devices And Displays With Improved Performance", filed on 15 Jun. 2006, U.S. patent application Ser. No. 11/071,244 of Jonathan S. Steckel et al (now U.S. Pat. No. 7,253,452), for "Blue Light Emitting Semiconductor Nanocrystal Materials" 4 Mar. 2005 (including U.S. Patent Application No. 60/550,314, filed on 8 Mar. 2004, from which it claims priority), U.S. Provisional Patent Application No. 60/825,373, filed 12 Sep. 2006, of Seth A. Coe-Sullivan et al., for "Light-Emitting Devices And Displays With Improved Performance"; U.S. Provisional Patent Application No. 60/825,374, filed 12 Sep. 2006, of Seth A. Coe-Sullivan et al., for "Light-Emitting Devices And Displays With Improved Performance", U.S. Application No. 60/866,262, filed 23 Jan. 2007, of Peter T. Kazlas et al., for "Light Emitting Devices And Displays With Improved Performance", and International Application No. PCT/US2007/024310, filed on 21 Nov. 2007, of Peter T. Kazlas et al., for ""Light-Emitting Devices And Displays With Improved Performance" (International Publication No. WO 2008/063657). The disclosures of each of the foregoing listed patent documents are hereby incorporated herein by reference in their entireties.

Other multilayer structures may optionally be used to improve the performance (see, for example, U.S. patent application Ser. No. 10/400,907 (now U.S. Pat. No. 7,332,211) and Ser. No. 10/400,908 (now U.S. Pat. No. 7,700,200), filed Mar. 28, 2003, each of which is incorporated herein by reference in its entirety) of the light-emitting devices and displays of the invention.

The performance of light emitting devices can be improved by increasing their efficiency, narrowing or broadening their emission spectra, or polarizing their emission. See, for example, Bulovic et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety. Semiconductor nanocrystals can be included in efficient hybrid organic/inorganic light emitting devices.

Because of the diversity of semiconductor nanocrystal materials that can be prepared, and the wavelength tuning via semiconductor nanocrystal composition, structure, and size, devices that are capable of emitting light of a predetermined color are possible with use of semiconductor nanocrystals as the emissive material. Semiconductor nanocrystal light-emitted devices can be tuned to emit anywhere in the spectrum.

The size and material of a semiconductor nanocrystal can be selected such that the semiconductor nanocrystal emits light having a predetermined wavelength.

Light-emitting devices can be prepared that emit visible or invisible (e.g., IR) light. The size and material of a semiconductor nanocrystal can be selected such that the semiconductor nanocrystal emits light having a predetermined wavelength. Light emission can be of a predetermined wavelength in any region of the spectrum, e.g., visible, infrared, etc. For example, the wavelength can be between 300 and 2,500 nm or greater, for instance between 300 and 400 nm, between 400 and 700 nm, between 700 and 1100 nm, between 1100 and 2500 nm, or greater than 2500 nm.

Individual light-emitting devices can be formed. In other embodiments, a plurality of individual light-emitting devices can be formed at multiple locations on a single substrate to form a display. A display can include a light-emitting device in accordance with the present invention and one or more additional devices that emit at the same or different wavelengths. By patterning the substrate with arrays of different color-emitting semiconductor nanocrystals, a display including pixels of different colors can be formed.

An individual light-emitting device or one or more light-emitting devices of a display can optionally include a mixture of different color-emitting semiconductor nanocrystals formulated to produce a white light. White light can alternatively be produced from a device including red, green, blue, and, optionally, additional color-emitting pixels.

Examples of other displays are included in U.S. Patent Application No. 60/771,643 for "Displays Including Semiconductor Nanocrystals And Methods Of Making Same", of Seth Coe-Sullivan et al., filed 9 Feb. 2006, the disclosure of which is hereby incorporated herein by reference in its entirety.

For additional information relating to semiconductor nanocrystals and their use, see also U.S. Patent Application Nos. 60/620,967, filed Oct. 22, 2004, and Ser. No. 11/032,163, filed Jan. 11, 2005 (U.S. Published Application No. 20060157720A1, now U.S. Pat. No. 8,134,175), U.S. patent application Ser. No. 11/071,244, filed 4 Mar. 2005 (now U.S. Pat. No. 7,253,452). Each of the foregoing patent applications is hereby incorporated herein by reference in its entirety.

As used herein, the singular forms "a", "an" and "the" include plural unless the context clearly dictates otherwise. Thus, for example, reference to an emissive material includes reference to one or more of such materials.

When an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention. Additional embodiments of the present invention will also be apparent to those skilled in the art from consideration of the specification and practice of the invention disclosed herein. It is intended that the specification and examples be considered as exemplary only, with a true scope and spirit of the invention being indicated by the following claims and equivalents thereof.

All patents, patent applications, and publications mentioned above are herein incorporated by reference in their entirety for all purposes. None of the patents, patent applications, and publications mentioned above are admitted to be prior art.

What is claimed is:

1. A device comprising a semiconductor nanocrystal including a core comprising a first semiconductor material comprising at least three chemical elements and a shell disposed over at least a portion of a surface of the core, the shell comprising a second semiconductor material, wherein the semiconductor nanocrystal is capable of emitting light upon excitation with a photoluminescence quantum efficiency greater than about 65%.

2. A device comprising a layer comprising a plurality of semiconductor nanocrystals and means for exciting the semiconductor nanocrystals, wherein at least a portion of the semiconductor nanocrystals comprise a semiconductor nanocrystal including a core comprising a first semiconductor material comprising at least three chemical elements and a shell disposed over at least a portion of a surface of the core, the shell comprising a second semiconductor material, wherein the semiconductor nanocrystal is capable of emitting light upon excitation with a photoluminescence quantum efficiency greater than about 65%.

3. A device including a semiconductor nanocrystal including a core comprising a first semiconductor material comprising at least three chemical elements and a shell disposed over at least a portion of the core, the shell comprising a second semiconductor material comprising at least three chemical elements, wherein the semiconductor nanocrystal is capable of emitting light with a photoluminescence quantum efficiency greater than about 60% upon excitation.

4. A device comprising a layer comprising plurality of semiconductor nanocrystals and means for exciting the semiconductor nanocrystals, wherein at least a portion of the semiconductor nanocrystals comprise a core comprising a first semiconductor material comprising at least three chemical elements and a shell disposed over at least a portion of the core, the shell comprising a second semiconductor material comprising at least three chemical elements, wherein the semiconductor nanocrystal is capable of emitting light with a photoluminescence quantum efficiency greater than about 60% upon excitation.

5. A device in accordance with claim 1 wherein the semiconductor nanocrystal is capable of emitting light with a photoluminescence quantum efficiency greater than about 80% upon excitation.

6. A device in accordance with claim 1 wherein the semiconductor nanocrystal is capable of emitting light with a photoluminescence quantum efficiency greater than about 90% upon excitation.

7. A device in accordance with claim 1 wherein the semiconductor nanocrystal is capable of emitting light with a photoluminescence quantum efficiency greater than about 95% upon excitation.

8. A device in accordance with claim 1 wherein the first semiconductor material comprises zinc, cadmium, and sulfur.

9. A device in accordance with claim 1 wherein the second semiconductor material comprises zinc and sulfur.

10. A device in accordance with claim 1 wherein the light includes a maximum peak emission with a full width at half maximum of not more than 40 nm.

11. A device in accordance with claim 1 wherein the light includes a maximum peak emission with a full width at half maximum of not more than 30 nm.

12. A device in accordance with claim 1 wherein the light includes a maximum peak emission with a full width at half maximum of not more than 20 nm.

13. A device in accordance with claim 1 wherein the device is a light-emitting device.

14. A device in accordance with claim 1 wherein the device is a display device.

15. A device in accordance with claim 2 wherein the means for exciting the semiconductor nanocrystals comprises a light source.

16. A device in accordance with claim 2 wherein the means for exciting the semiconductor nanocrystals comprises a first electrode disposed on a substrate and a second electrode opposed to the first electrode and the layer comprising semiconductor nanocrystals is disposed between the two electrodes and in electrical communication therewith.

17. A device in accordance with claim 3 wherein the light includes a maximum peak emission with a full width at half maximum of not more than 40 nm.

18. A device in accordance with claim 3 wherein the device is a light-emitting device.

19. A device in accordance with claim 3 wherein the first semiconductor material comprises zinc, cadmium, and selenium.

20. A device in accordance with claim 4 wherein the first semiconductor material comprises zinc, cadmium, and selenium.

21. A device in accordance with claim 3 wherein the device is a display device.

* * * * *